(12) United States Patent
Ausserlechner

(10) Patent No.: US 9,484,525 B2
(45) Date of Patent: Nov. 1, 2016

(54) HALL EFFECT DEVICE

(75) Inventor: Udo Ausserlechner, Villach (AT)

(73) Assignee: Infineon Technologies AG, Neubiberg (DE)

( * ) Notice: Subject to any disclaimer, the term of this patent is extended or adjusted under 35 U.S.C. 154(b) by 1067 days.

(21) Appl. No.: 13/472,012

(22) Filed: May 15, 2012

(65) Prior Publication Data

US 2013/0307609 A1 Nov. 21, 2013

(51) Int. Cl.
*H01L 43/04* (2006.01)
*H01L 43/14* (2006.01)
*H03K 17/90* (2006.01)
*G01R 33/07* (2006.01)
*H01L 43/06* (2006.01)

(52) U.S. Cl.
CPC .............. *H01L 43/04* (2013.01); *G01R 33/07* (2013.01); *H01L 43/065* (2013.01); *H01L 43/14* (2013.01); *H03K 17/90* (2013.01)

(58) Field of Classification Search
CPC ..... G01R 33/07; H01L 43/04; H01L 43/065; H01L 43/14; H01L 43/08; H01L 27/22; H01L 43/06; H03K 17/90
USPC ......................................................... 324/251
See application file for complete search history.

(56) References Cited

U.S. PATENT DOCUMENTS

| 4,673,964 A | * | 6/1987 | Popovic | .................. | H01L 27/22 257/426 |
| 4,782,375 A | * | 11/1988 | Popovic | ............... | G01R 15/202 257/426 |
| 4,829,352 A | * | 5/1989 | Popovic | .................. | H01L 27/22 257/426 |
| 4,864,223 A | * | 9/1989 | Joder | ..................... | G01R 21/08 324/117 H |
| 4,929,993 A | * | 5/1990 | Popovic | .................. | H01L 27/22 257/424 |
| 5,057,890 A | * | 10/1991 | Falk | ..................... | H01L 43/065 257/427 |
| 6,278,271 B1 | * | 8/2001 | Schott | ................... | G01R 33/07 257/422 |

(Continued)

FOREIGN PATENT DOCUMENTS

DE 102006017910 A1 10/2007
DE 102006037226 A1 2/2008

(Continued)

OTHER PUBLICATIONS

"Limits of offset cancellation by the principle of spinning current Hall probe", by Udo Ausserlechner, Proc. of IEEE Sensors 2004, Oct. 24-27, 2004, vol. 3, p. 1117-1120. 4 Pages.

(Continued)

*Primary Examiner* — Jermele M Hollington
*Assistant Examiner* — Christopher McAndrew
(74) *Attorney, Agent, or Firm* — Eschweiler & Associates, LLC

(57) ABSTRACT

Embodiments of the present invention provide a Hall effect device that includes a Hall effect region of a first semiconductive type, at least three contacts and a lateral conductive structure. The Hall effect region is formed in or on top of a substrate, wherein the substrate includes an isolation arrangement to isolate the Hall effect region in a lateral direction and in a depth direction from the substrate or other electronic devices in the substrate. The at least three contacts are arranged at a top of the Hall effect region to supply the Hall effect device with electric energy and to provide a Hall effect signal indicative of the magnetic field, wherein the Hall effect signal is generated in a portion of the Hall effect region defined by the at least three contacts. The lateral conductive structure is located between the Hall effect region and the isolation arrangement.

11 Claims, 17 Drawing Sheets

(56) References Cited

U.S. PATENT DOCUMENTS

| | | | |
|---|---|---|---|
| 6,492,697 B1* | 12/2002 | Plagens | G01R 33/07 257/421 |
| 7,043,887 B2 | 5/2006 | Van Ootmarsum | |
| 7,253,490 B2* | 8/2007 | Oohira | G01R 33/07 257/424 |
| 7,872,322 B2 | 1/2011 | Schott et al. | |
| 8,093,891 B2* | 1/2012 | Rocznik | G01R 33/07 324/251 |
| 8,222,679 B2* | 7/2012 | Uhlig | G01R 33/07 257/252 |
| 8,466,526 B2* | 6/2013 | Hioka | G01R 33/07 257/421 |
| 8,723,515 B2* | 5/2014 | Motz | G01R 33/0029 324/117 H |
| 8,981,504 B2* | 3/2015 | Motz | G01R 33/07 257/414 |
| 2004/0040237 A1 | 3/2004 | Van Ootmarsum | |
| 2005/0230770 A1* | 10/2005 | Oohira | G01R 33/07 257/421 |
| 2006/0011999 A1 | 1/2006 | Schott et al. | |
| 2006/0097715 A1* | 5/2006 | Oohira | G01R 33/066 324/207.2 |
| 2006/0170406 A1* | 8/2006 | Kawashima | G05F 1/635 323/294 |
| 2006/0254198 A1 | 11/2006 | Van Ootmarsum | |
| 2007/0290682 A1* | 12/2007 | Oohira | G01R 33/07 324/251 |
| 2009/0256559 A1* | 10/2009 | Ausserlechner | G01R 33/07 324/251 |
| 2009/0295375 A1* | 12/2009 | Oohira | G01D 5/145 324/207.21 |
| 2011/0018532 A1* | 1/2011 | Florescu | G01N 33/54326 324/251 |
| 2012/0016614 A1 | 1/2012 | Hohe et al. | |
| 2012/0169329 A1* | 7/2012 | Hellwig | G01R 33/07 324/251 |

FOREIGN PATENT DOCUMENTS

| | | |
|---|---|---|
| JP | 2005259803 A | 9/2005 |
| WO | 2004025742 A1 | 3/2004 |
| WO | 2007121885 A1 | 11/2007 |

OTHER PUBLICATIONS

Improvements of CMOS Hall Microsystems and Application for Absolute Angular Position Measurements, by Michel Demierre, 2003, chapter 4.4.. 4 Pages.

Hall Devices for Magnetic Sensor Microsystems, by R. S. Popovic, Transducers '97, 1997 Int'l Conf Solid-State Sensors and Actuators, Chicago, Jun. 16-19, 1997, p. 377-380. 4 Pages.

\* cited by examiner

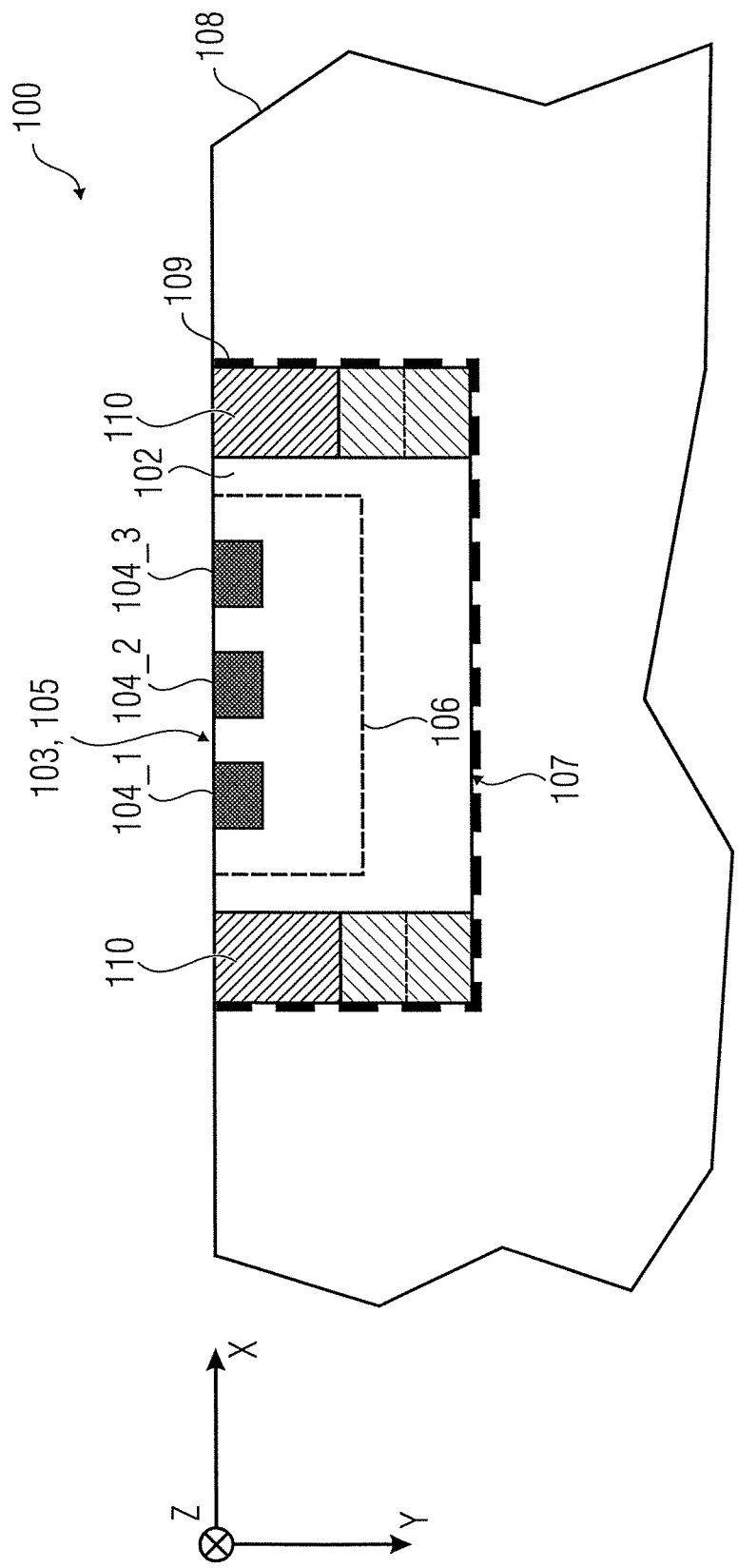

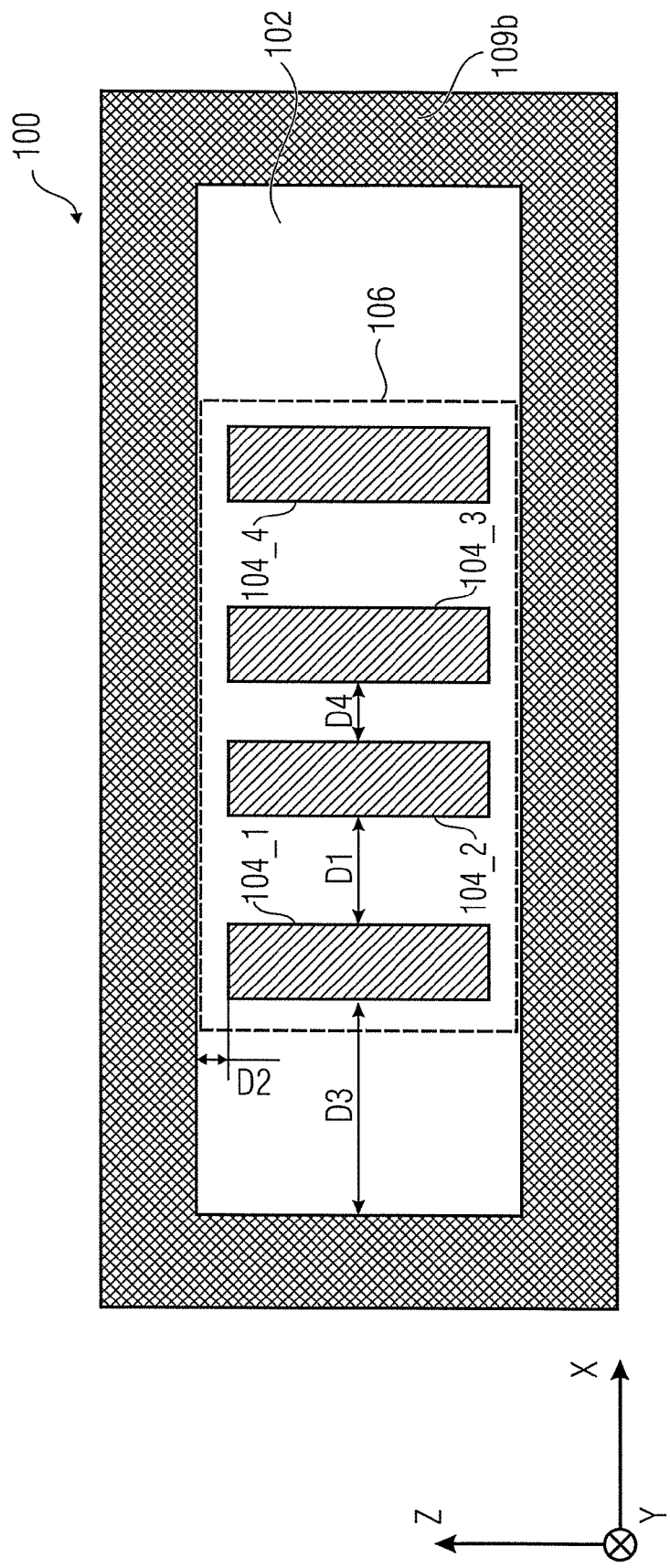

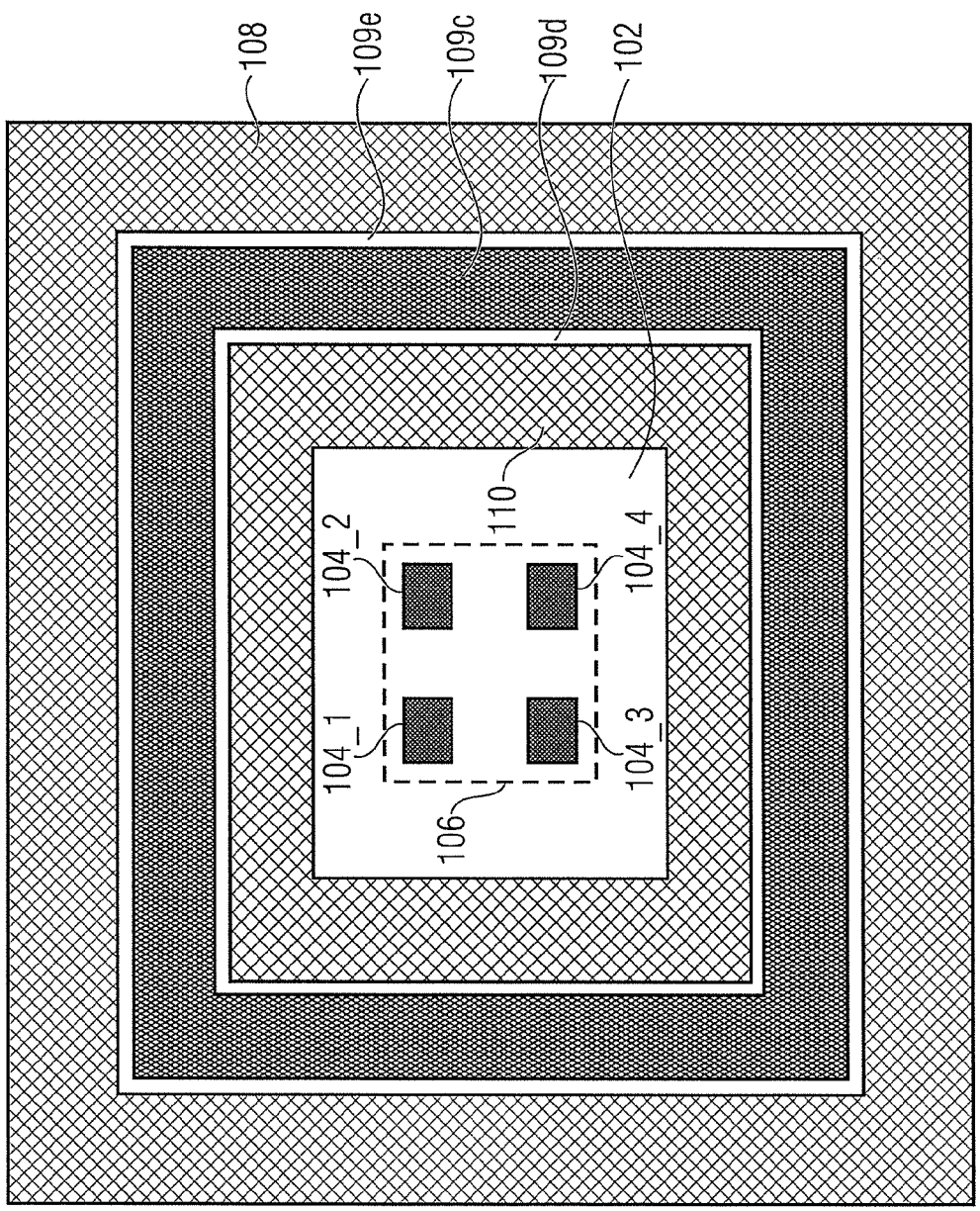
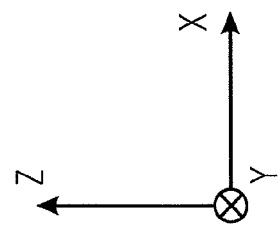
FIG 10B

HALL EFFECT DEVICE

FIELD

Embodiments relate to a Hall effect device indicative of a magnetic field. Some embodiments relate to a linearization of Hall sensors.

BACKGROUND

Hall effect devices are magnetic field sensors that are adapted to sense a magnetic field based on the Hall effect. Moreover, Hall effect devices can be used for a variety of applications, such as proximity switching, positioning, speed detection and current sensing applications.

SUMMARY

Embodiments provide a Hall effect device indicative of a magnetic field. The Hall effect device comprises a Hall effect region of a first semiconductive type, at least three contacts and a lateral conductive structure. The Hall effect region is formed in or on top of a substrate, wherein the substrate comprises an isolation arrangement to isolate the Hall effect region in a lateral direction and in a depth direction from the substrate and/or other electronic devices in the substrate. The at least three contacts are arranged at a top of the Hall effect region to supply the Hall effect device with electric energy and to provide a Hall effect signal indicative of the magnetic field, wherein the Hall effect signal is generated in a portion of the Hall effect region defined by the at least three contacts. The lateral conductive structure is located between the Hall effect region and the isolation arrangement, wherein a doping concentration of the lateral conductive structure is higher than a doping concentration of the Hall effect region.

In some embodiments, the Hall effect device comprises a buried layer of the first semiconductive type formed in the substrate at a bottom of the Hall effect region, wherein a doping concentration of the buried layer is higher than a doping concentration of the Hall effect region.

Further embodiments provide a Hall effect device indicative of a magnetic field. The Hall effect device comprises a Hall effect region of a first semiconductive type, at least three contacts and a lateral conductive structure of the first semiconductive type. The Hall effect region is formed in or on top of a substrate, wherein the substrate comprises an isolation arrangement to isolate the Hall effect region in a lateral direction and in a depth direction from the substrate and/or other electronic devices in the substrate. The at least three contacts are arranged at a top of the Hall effect region to supply the Hall effect device with electric energy and to provide a Hall effect signal indicative of the magnetic field, wherein the Hall effect signal is generated in a portion of the Hall effect region defined by the at least three contacts. The lateral conductive structure is located between the Hall effect region and the isolation arrangement, wherein a doping concentration of the lateral conductive structure is higher than a doping concentration of the Hall effect region. The at least three contacts are arranged at the top of the Hall effect region such that a vertical distance between the isolation arrangement and each contact of the at least three contacts is equal to or greater than a distance between adjacent contacts of the at least three contacts.

Further embodiments provide a Hall effect device indicative of a magnetic field. The Hall effect device comprises a Hall effect region of a first semiconductive type, at least three contacts and a buried layer of the first semiconductive type. The Hall effect region is formed in or on top of a substrate, wherein the substrate comprises an isolation arrangement to isolate the Hall effect region in a lateral direction and in a depth direction from the substrate and/or other electronic devices in the substrate. The at least three contacts are arranged at a top of the Hall effect region to supply the Hall effect device with electric energy and to provide a Hall effect signal indicative of the magnetic field, wherein the Hall effect signal is generated in a portion of the Hall effect region defined by the at least three contacts. The buried layer is formed in the substrate at a bottom of the Hall effect region, wherein a doping concentration of the buried layer is higher than a doping concentration of the Hall effect region. The at least three contacts are arranged at the top of the Hall effect region such that a lateral distance between the isolation arrangement and each contact of the at least three contacts is equal to or greater than a distance between adjacent contacts of the at least three contacts.

BRIEF DESCRIPTION OF THE DRAWINGS

Embodiments of the present invention are described herein making reference to the appended drawings.

FIG. 1a shows a cross-sectional view of a Hall effect device according to an embodiment.

FIG. 3 shows a top view of a vertical Hall effect device.

FIG. 10b shows a top view of a horizontal Hall effect device according to an embodiment.

FIG. 11a shows a flowchart of a method for manufacturing the Hall effect device shown in FIG. 1a.

FIG. 11b shows a flowchart of a method for manufacturing the Hall effect device shown in FIG. 2a.

Figure 1B:
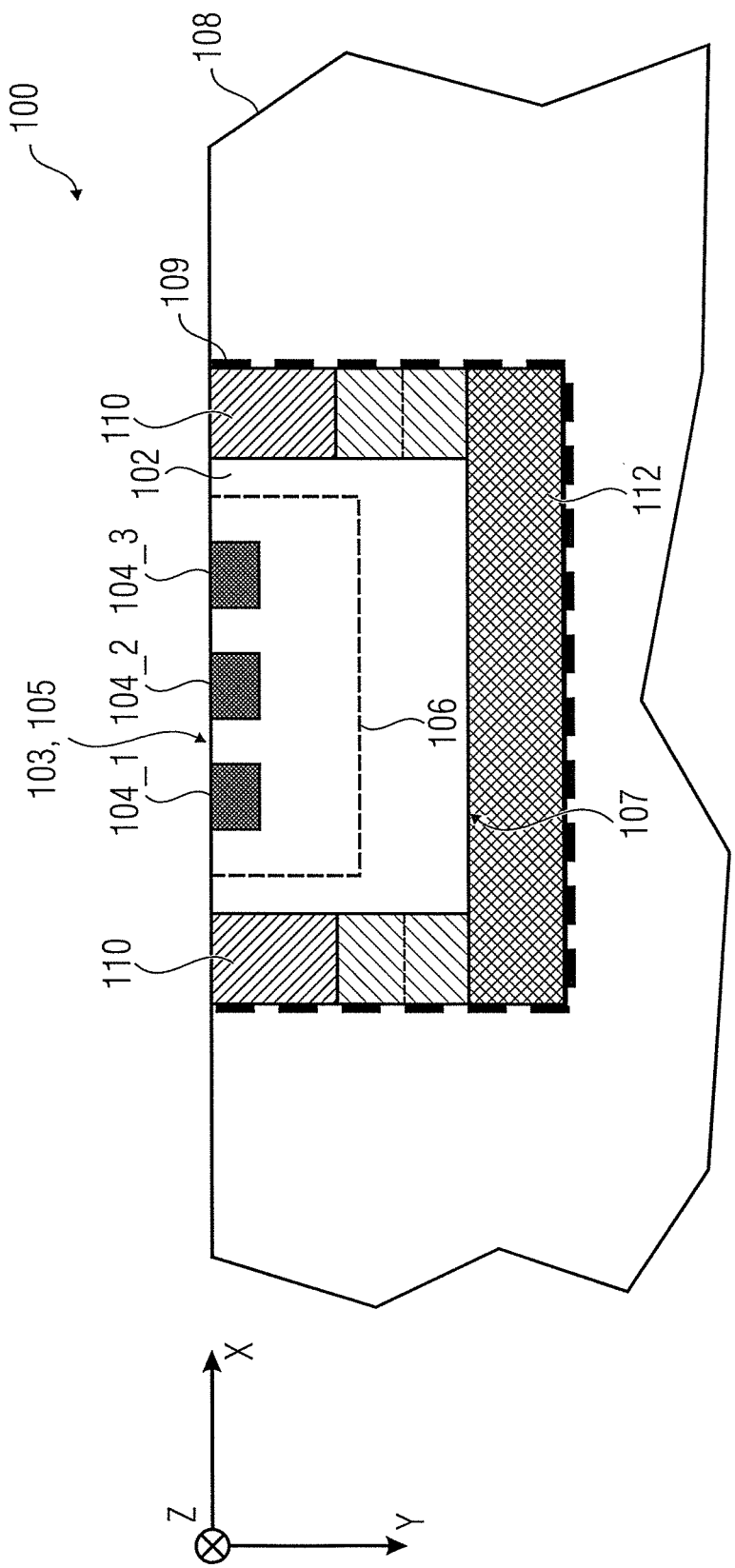
FIG. 1b shows a cross-sectional view of a Hall effect device according to an embodiment.

Equal or equivalent elements or elements with equal or equivalent functionality are denoted in the following description by equal or equivalent reference numerals.

DETAILED DESCRIPTION

In the following description, a plurality of details are set forth to provide a more thorough explanation of embodiments of the present invention. However, it will be apparent to those skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

FIG. 1a shows a cross-sectional view of a Hall effect device 100 according to an embodiment. The Hall effect device 100 comprises a Hall effect region 102 of a first semiconductive type, at least three contacts 104_1 to 104_n (n≥3) and a lateral conductive structure 110 of the first semiconductive type. The Hall effect region 102 is formed in or on top 103 of a substrate 108, wherein the substrate 108 comprises an isolation arrangement 109 to isolate the Hall effect region 102 in a lateral direction and in a depth direction from the substrate 108 and/or other electronic devices in the substrate 108. The at least three contacts 104_1 to 104_n (n≥3) are arranged at a top 105 of the Hall effect region 102 to supply the Hall effect device 100 with electric energy and to provide a Hall effect signal indicative of the magnetic field, wherein the Hall effect signal is generated in a portion 106 of the Hall effect region 102 defined by the at least three contacts 104_1 to 104_n (n≥3). The lateral conductive structure 110 is located between the Hall effect region 102 and the isolation arrangement 109.

In some embodiments, electrical nonlinearities of the Hall effect device 100 caused by the isolation arrangement 109, for example, due to junction field effects and MOSFET (MOSFET=metal-oxide-semiconductor field-effect transistor) effects, can be reduced or even avoided by the lateral conductive structure 110 which is located between the Hall effect region 102 and the isolation arrangement 109.

In some embodiments, the lateral conductive structure 110 and the Hall effect region 102 can be in ohmic contact. Thereby, the lateral conductive structure 110 may shield the active Hall effect region 102 from the isolation arrangement 109. This can improve the electrical linearity of the Hall effect device 100 and consequently it can improve the residual offset obtained by spinning current techniques, as explained in the following.

For example, if a spinning current technique is applied to drive or operate the Hall effect device 100, then the role of supply and sense contacts are exchanged in subsequent phases (the supply contacts are the contacts of the at least three contacts 104_1 to 104_n (n≥3) that are used for supplying the Hall effect device 100 with electric energy (e.g., electric voltage or current), wherein the sense contacts are the to of the at least three contacts 104_to 104_n (n≥3) that are used for providing the Hall effect signal). In that case, the Hall effect signals (or outputs signals) of subsequent phases (e.g., first phase and second phase) can be added or subtracted so that the offset (e.g., zero point error) cancels and a strong signal with respect to the applied magnetic field remains. Nevertheless, the offset cancelation requires an electrically linear Hall effect device in order to work properly. As already mentioned, embodiments provide a Hall effect device 100 comprising a lateral conductive structure 110 arranged between the Hall effect region 102 and the isolation arrangement 109 in order to reduce or even avoid the electrical nonlinearities caused by the isolation arrangement 109.

FIG. 1b shows a cross-sectional view of a Hall effect device 100 according to an embodiment. In addition to FIG. 1a, the Hall effect device 100 further comprises a buried layer 112 of the first semiconductive type formed in the substrate 108 at a bottom 107 of the Hall effect region 102, wherein a doping concentration of the buried layer 112 is higher than a doping concentration of the Hall effect region 102.

In known Hall effect devices the Hall effect region is isolated from its surroundings. In contrast to that, in embodiments, a conductive shield (e.g. the lateral conductive structure 110 and/or the buried layer 112) is inserted between the Hall effect region 102 and the isolation arrangement 109. The conductive shield may enclose the Hall effect region 102 or at least a part of the Hall effect region 102 and hence shield or reduce or eliminate an influence of the isolation arrangement 109 on the Hall effect region 102.

Figure 2A:
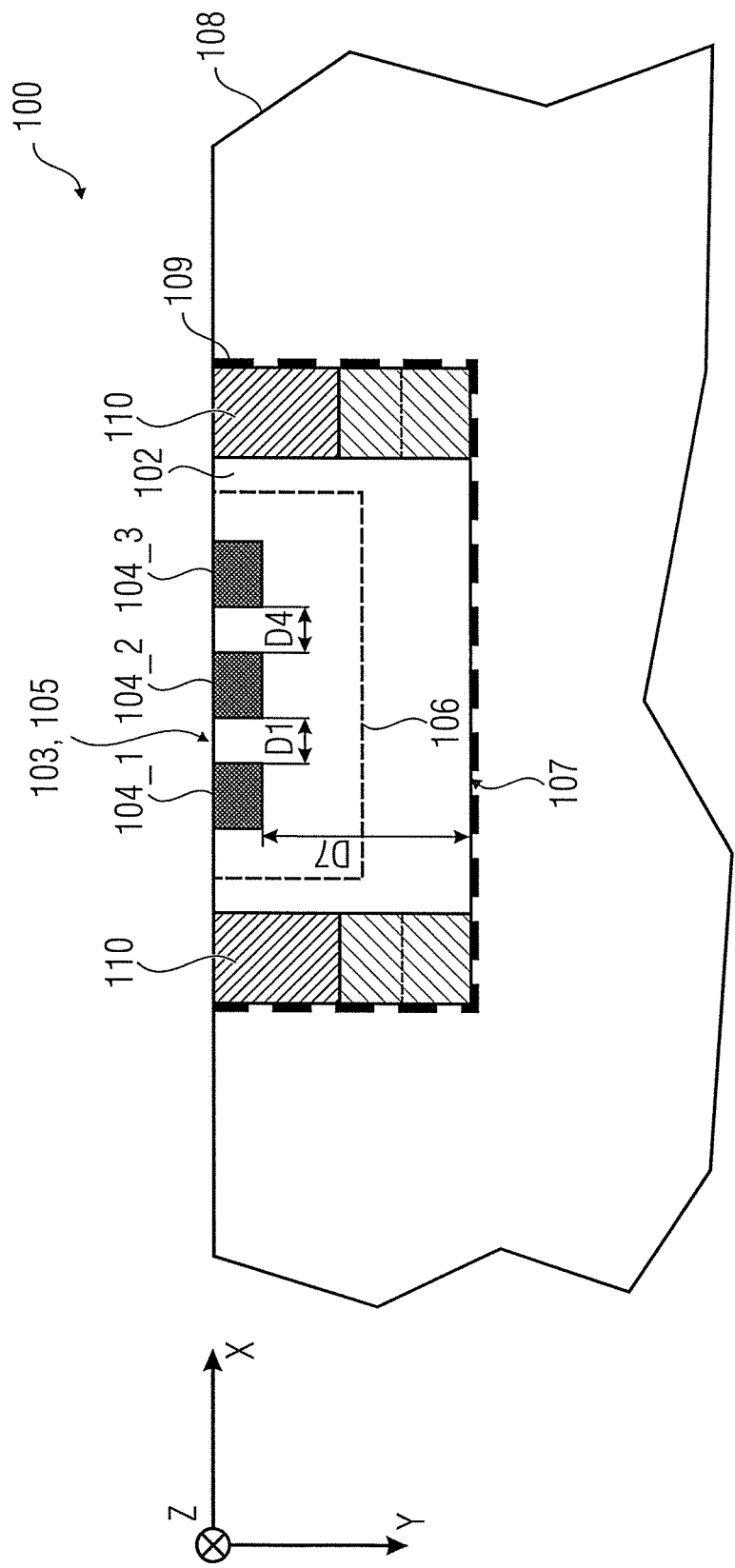
FIG. 2a shows a cross-sectional view of a Hall effect device according to another embodiment.

FIG. 2a shows a cross-sectional view of a Hall effect device 100 according to another embodiment. The Hall effect device 100 comprises a Hall effect region 102 of a first semiconductive type, at least three contacts 104_1 to 104_n (n≥3) and a lateral conductive structure 110 of the first semiconductive type. The Hall effect region 102 is formed in or on top 103 of a substrate 108, wherein the substrate 108 comprises an isolation arrangement 109 to isolate the Hall effect region 102 in a lateral direction and in a depth direction from the substrate 108 and/or other electronic devices in the substrate 108. The at least three contacts 104_1 to 104_n (n≥3) are arranged at a top 105 of the Hall effect region 102 to supply the Hall effect device 100 with electric energy and to provide a Hall effect signal indicative of the magnetic field, wherein the Hall effect signal is generated in a portion 106 of the Hall effect region 102 defined by the at least three contacts 104_1 to 104_n (n≥3). The lateral conductive structure 110 is located between the Hall effect region 102 and the isolation arrangement 109. The at least three contacts 104_1 to 104_n (n≥3) are arranged at the top 105 of the Hall effect region 102 in such a way that a vertical distance D7 between the isolation arrangement 109 and each of the at least three contacts 104_1 to 104_n (n≥3) is equal to or greater than a minimum lateral distance D1, D4 between adjacent contacts of the at least three contacts 104_1 to 104_n (n≥3).

In some embodiments, electrical nonlinearities of the Hall effect device 100 caused by the isolation arrangement 109, for example, due to junction field effects and MOSFET effects, can be reduced or even avoided by arranging the at least three contacts 104_1 to 104_n (n≥3) such that the vertical distance D7 between the isolation arrangement 109 and each of the at least three contacts 104_1 to 104_n (n≥3) is equal to or greater than a minimum lateral distance D1, D4 between adjacent contacts in combination with a lateral conductive structure 110.

For example, if the Hall effect device 100 comprises a lateral conductive structure 110, then a distance in the depth direction (vertical distance) between the isolation arrangement 109 and each of the at least three contacts 104_1 to 104_n (n≥3) is equal to or greater than a minimum lateral distance between adjacent contacts of the at least three contacts 104_1 to 104_n (n≥3), e.g., the vertical distance D7 between the first contact 104_1 and the isolation arrangement 109 is greater than or equal to the lateral distance D1 between the first contact 104_1 and the second contact 104_2, and greater than or equal to the distance D4 between the second contact 104_2 and the third contact 104_3.

Figure 2B:
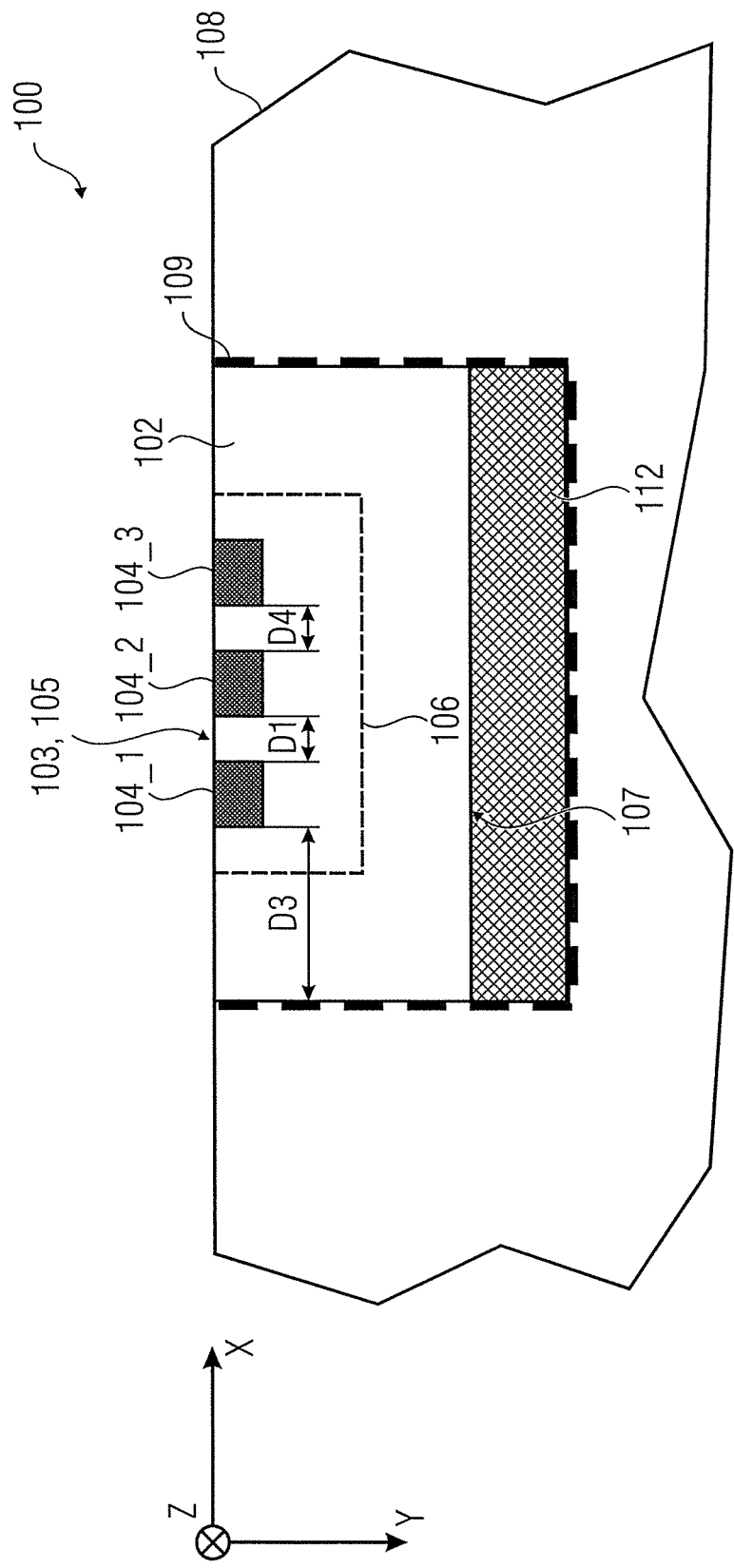
FIG. 2b shows a cross-sectional view of a Hall effect device according to another embodiment.

FIG. 2b shows a cross-sectional view of a Hall effect device 100 according to another embodiment. The Hall effect device 100 comprises a Hall effect region 102 of a first semiconductive type, at least three contacts 104_1 to 104_n (n≥3) and a buried layer 112 of the first semiconductive type. The Hall effect region 102 is formed in or on top 103 of a substrate 108, wherein the substrate 108 comprises an isolation arrangement 109 to isolate the Hall effect region 102 in a lateral direction and in a depth direction from the substrate 108 and/or other electronic devices in the substrate 108. The at least three contacts 104_1 to 104_n (n≥3) are arranged at a top 105 of the Hall effect region 102 to supply the Hall effect device 100 with electric energy and to provide a Hall effect signal indicative of the magnetic field, wherein the Hall effect signal is generated in a portion 106 of the Hall effect region 102 defined by the at least three contacts 104_1 to 104_n (n≥3). The buried layer 112 is formed in the substrate 108 at a bottom 107 of the Hall effect region 102, wherein a doping concentration of the buried layer 112 is higher than a doping concentration of the Hall effect region 102. The at least three contacts 104_1 to 104_n (n≥3) are arranged at the top 105 of the Hall effect region 102 in such a way that a lateral distance D3 between the isolation arrangement 109 and each of the at least three contacts 104_1 to 104_n (n≥3) is equal to or greater than a minimum lateral distance D1, D4 between adjacent contacts of the at least three contacts 104_1 to 104_n (n≥3).

In some embodiments, electrical nonlinearities of the Hall effect device 100 caused by the isolation arrangement 109, for example, due to junction field effects and MOSFET effects, can be reduced or even avoided by arranging the at least three contacts 104_1 to 104_n (n≥3) such that the lateral distance D3 between the isolation arrangement 109 and each of the at least three contacts 104_1 to 104_n (n≥3) is equal to or greater than a minimum lateral distance D1, D4 between adjacent contacts in combination with a buried layer 112.

For example, if the Hall effect device 100 comprises a buried layer 112, then a lateral distance between the isolation arrangement 109 and each of the at least three contacts 104_1 to 104_n (n≥3) is equal to or greater than a minimum lateral distance between adjacent contacts of the at least three contacts 104_1 to 104_n (n≥3), e.g., the distance D3 between the first contact 104_1 and the isolation arrangement 109 is greater than or equal to the distance D1 between the first contact 104_1 and the second contact 104_2, and greater than or equal to the distance D4 between the second contact 104_2 and the third contact 104_3.

Note that the Hall effect device 100 shown in FIGS. 2a and 2b can also comprise both, the lateral conductive structure 110 and the buried layer 112. In that case, according to some embodiments, for example, the embodiment of FIG. 1b, the distance between the isolation arrangement 109 and each of the at least three contacts 104_1 to 104_n (n≥3) can be, but does not have to be, greater than or equal to the minimum distance between adjacent contacts of the at least three contacts 104_1 to 104_n (n≥3).

The following description of embodiments of the Hall effect device 100 do apply to the Hall effect device 100 shown in FIGS. 1a and 1b and to the Hall effect device 100 shown in FIGS. 2a and 2b.

Thereby, some of the appended drawings show an x-y-z-reference coordinate system having an x-axis, y-axis and z-axis perpendicular to each other. The x-y-z-reference coordinate system is arranged such that the x-axis and the z-axis span a plane (x-z-plane) parallel to the top 105 of the Hall effect region 102, wherein the x-axis and the y-axis span a plane (x-y-plane) across the Hall effect region 102. In some embodiments, the lateral direction may refer to a direction parallel to the x-z-plane, wherein the depth direction or vertical direction may refer to a direction parallel to the y-axis.

As shown in FIGS. 1 and 2, the Hall effect device 100 can comprise three contacts 104_1 to 104_n (n=3) arranged at the top 105 of the Hall effect region 102. Naturally, the Hall effect device can comprise up to n contacts 104_1 to 104_n, wherein n is a natural number greater than or equal to three (n≥3).

As indicated in FIGS. 1 and 2, the lateral conductive structure 110 can be formed in the Hall effect region 102 from the top 105 of the Hall effect region 102 in the depth direction (y-direction) towards the bottom 107 of the Hall effect region 102. Thereby, the lateral conductive structure 110 may extend from the top of the Hall effect region in the depth direction (y-direction) over only a part or portion of the Hall effect region 102, such as 30%, 40%, 50%, 60%, 70%, 80% or 90% of the Hall effect region 102, or even over the entire Hall effect region 102 up to the bottom 107 of the Hall effect region 102. Moreover, if the lateral conductive structure 110 extends only little into the depth direction it can extend further into the lateral direction to make up for the loss in the depth direction.

In some embodiments, the lateral conductive structure 110 can comprise a ring shape, i.e. the lateral conductive structure 110 can surround the Hall effect region completely (in lateral direction). Just like for the vertical extension of the lateral conductive structure 110, which does not necessarily need to extend entirely 100% down the Hall effect region 102, also the ring shape may have similar gaps in-between. As long as the gaps are narrow enough that the shielding effect is efficient enough so that the nonlinear effects at the isolation interface are effectively decoupled from the active Hall effect region 106. Typically a gap in the conductive structure both in vertical or lateral direction can be narrow compared to the width (in lateral direction) of the lateral conductive structure. In case the lateral conductive structure is not a closed ring, but composed of several disjunct parts it is advisable to make ohmic contacts to each part and connect them all to a common node (which might be floating or which may be tied to a certain potential like ground potential, half or full supply potential of the device).

In some embodiments, the substrate 108 can be of a second semiconductive type, wherein the isolation arrangement 109 can be adapted to provide in an operation mode a reverse biased semiconductor junction between the Hall effect region 102 and the substrate 108.

Furthermore, the Hall effect region 102 of the first semiconductive type can be a semiconductor region doped with donors providing an excess of negative charge carriers (n-type), wherein the substrate 108 of the second semiconductive type can be a semiconductor doped with acceptors providing an excess of positive charge carriers (p-type). Naturally, the Hall effect region 102 of the first semiconductive type can also be a semiconductor region doped with acceptors providing an excess of positive charge carriers (p-type), wherein the substrate of the second semiconductive type can be a semiconductor doped with donors providing an excess of negative charge carriers (n-type). Of course additional tubs may be involved, so that the Hall effect region 102 may lie entirely within a tub of opposite semiconductor type. In some technologies it can be necessary to have an n-doped Hall effect region 102 within a p-tub, where the p-tub is within an n-epitaxial layer on top of a p-type substrate. Then it is common practice to tie p-tub, n-epi, and p-substrate to lowest potential in the circuit, which is ground potential or negative supply potential.

Subsequently it assumed that the Hall effect region 102 is a n-type region and the substrate is a p-type substrate. Thereby, a reverse biased pn-junction between the Hall effect region 102 and the substrate 108 can be used to form the isolation arrangement 109. Nevertheless, the subsequent description does also apply to a p-type Hall effect region 102 and an n-type substrate and to other isolation arrangements 109.

As already mentioned, the spinning current technique can be used to supply the Hall effect device 100 with electric energy and to provide the Hall effect signal indicative of the magnetic field. Thereby, in subsequent clock phases the role of supply and sense contacts of the at least three contacts 104_1 to 104_n of the Hall effect device 100 can be exchanged. The Hall effect signals (output signals) of the Hall effect device 100 in two clock phases can be added or subtracted so that the offset (e.g., zero point error) cancels and a strong signal with respect to the applied magnetic field remains.

The offset cancellation works perfectly only for electrically linear Hall effect devices. By electrical linearity the current-voltage characteristic is meant in contrast to magnetic linearity in the relationship between Hall effect signal (or output signal) versus applied magnetic field. For an electrically linear Hall effect device the current into a contact (or terminal) is a linear function of the potential applied to this contact (or terminal). Nevertheless, integrated Hall effect devices are not linear due to several reasons.

A first source of nonlinearity is velocity saturation. If a large voltage is applied between two contacts (or terminals) in close proximity this causes a high electric field. At high electric fields the mobility of the charge carriers decreases and this causes a nonlinear relation between voltage and current.

A second source of nonlinearity is the junction field effect. Hall effect devices are mainly composed of an n-type Hall effect region which is isolated from the rest of the circuit by placing it in a p-type tub or substrate. This gives a pn-junction which can function as an isolation if it is reverse biased. To this end the lowest potential applied to the Hall effect device is also applied to the p-tub. This reverse-biased pn-junction leads to a charge depletion layer whose thickness depends on the reverse bias voltage. This depletion layer goes at the cost of the Hall effect region: wherever the potential in the Hall effect region is high the reverse bias voltage is large and the depletion layer is thick. Thus the width of the Hall effect region is reduced there and so this region becomes less conductive. Another pn-junction is caused along the interface between the top of the Hall effect region and a shallow p-implant which is used as a top plate to avoid flicker-noise and lifetime drift caused by traps and mobile ions in the surface.

A third source for nonlinearity are charge modulation effects as are found in the channel of MOSFETs. Such a modulation is also caused (in weaker form than in the MOSFETs) below a metal or poly-silicon top plate and also at the side walls of the Hall effect region if isolation is done by p-trenches that are coated with thin oxides. In all these cases the Hall effect region is isolated by a thin dielectric layer from a conductive electrode (the top plate or the trench). Usually the electrode is at a low potential and at least some parts of the Hall effect region are at a high potential: this is analogous to a PMOS (PMOS=p-channel metal-oxide semiconductor), where the bulk corresponds to the Hall effect region and the gate to the top plate or trench. This MOSFET structure modulates the charge density in the Hall effect region and causes electrical nonlinearities.

In some embodiments, junction field effects and MOSFET effects are avoided by a large distance between all (supply and sense) contacts 104_1 to 104_n (n≥3) of the Hall effect device 100 and the isolation 109. Whenever a large distance is not possible, a highly conductive shield, e.g., the lateral conductive structure 110 or the buried layer 112, is interposed.

In some embodiments, the isolation 109 (or isolation arrangement 109) may refer to a pn-isolation, trench-isolation or any other kind of isolation done by thin dielectric coatings.

As already mentioned, the Hall effect device 100 comprises a lateral conductive structure 110 and/or a buried layer 112 in order to avoid electrical nonlinearities caused by the isolation 109, e.g., via junction field effects and/or MOSFET effects. Note that the isolation 109 cannot be avoided. The isolation 109 is required to isolate the Hall effect device 100 from other parts of the circuit in order to realize an integrated sensor (e.g., a sensor with additional signal processing circuits on a single die).

A compromise is to push the isolation 109 far away from the relevant region of the Hall effect (or portion of the Hall effect region 102 defined by the at least three contacts 104_1 to 104_n (n≥3)). Note that not the entire Hall effect region 102 has the same importance for the output signal of the Hall effect device 100. Only these parts of the Hall effect region 102 are important, where significant current flows. Note that the device is usually operated in a spinning current mode, so that current can flow in different directions during different operating phases of the spinning current scheme. The Hall effect device 100 can have two supply contacts (or terminals) (for positive and negative supply) and two sense contacts (or terminals) (where the output signal is tapped). It is possible to have more supply and sense contacts (or terminals), yet then they are shorted or added up by the signal processing circuit. In a first operating phase current flows through the supply contacts (or terminals) and a signal is tapped at the sense contacts (or terminals). In a second operating phase the roles of supply and sense contacts (or terminals) are swapped. This means that the portion 106 of the Hall effect region 102 between all supply and sense contacts (or terminals) 104_1 to 104_n (n≥3) and the portions in immediate proximity to these supply and sense contacts (or terminals) 104_1 to 104_n (n≥3) are the most relevant ones for the Hall effect.

Therefore, all isolations 109 can be placed far away from the relevant region 106 of the Hall effect. By "far" "a considerable portion of the distance between neighboring supply/sense-contacts 104_1 to 104_n (n≥3)" is meant, as will become clear from the following discussion.

FIG. 3 shows a top view of a vertical Hall effect device 100. The vertical Hall effect device 100 comprises four contacts 104_1 to 104_n (n=4) arranged at a top 105 of the Hall effect region 102. The distances D1 and D4 denote minimum distances between adjacent contacts, i.e., the distance D1 denotes a minimum distance between a first contact 104_1 and a second contact 104_2 of the four contacts 104_1 to 104_n (n=4), wherein the distance D4 denotes a minimum distance between the second contact 104_2 and a third contact 104_3 of the four contacts 104_1 to 104_n (n=4). Moreover, the distances D2 and D3 denote lateral distances between the relevant Hall region 106 and the isolation 109. The isolation 109 can be a p-ring 109*b*, wherein the Hall effect region 102 can be a n-type Hall effect region 102.

In other words, although the outmost contacts 104_1 and 104_4 are quite far away from the isolation 109 (distance D3>max(D1,D4)) there are other locations where the distance between relevant Hall region 106 and isolation 109 is smaller (distance D2<max(D1,D4)). At this spot of closest distance between relevant Hall region 106 and isolation 109 strong nonlinearity effects happen.

Figure 4:
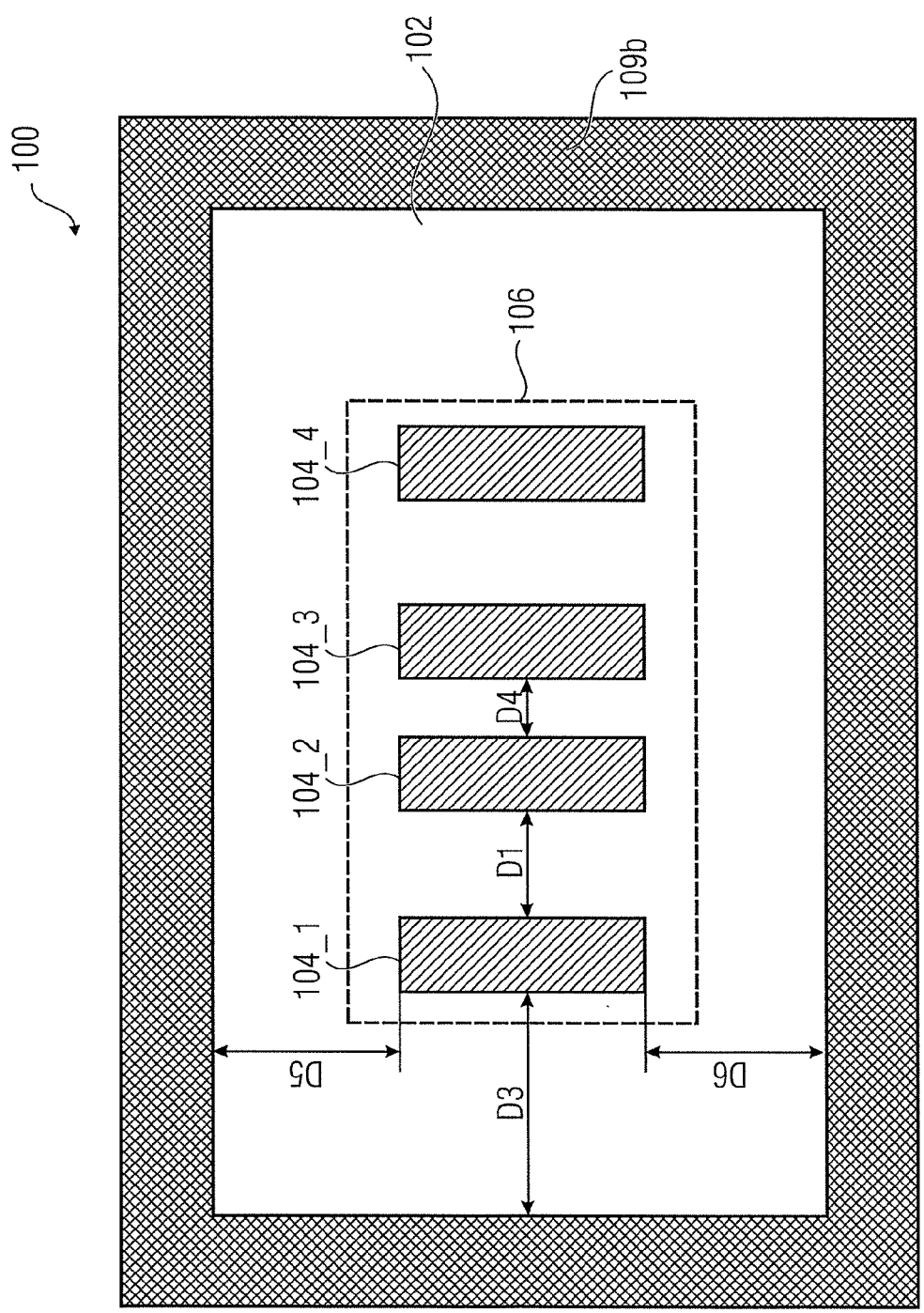
FIG. 4 shows a top view of a vertical Hall effect device according to an embodiment.

FIG. 4 shows a top view of a vertical Hall effect device 100 according to an embodiment. In contrast to FIG. 3, the lateral distances, e.g., D3, D5 and D6, between the isolation arrangement 109 comprising an isolation ring 109b (e.g. a p-ring) and each of the at least three contacts 104_1 to 104_n (n=4) is equal to or greater than a minimum lateral distance, e.g., D1 or D4, between adjacent contacts of the at least three contacts 104_1 to 104_n (n=4).

Note that the isolation ring 109b can comprise an "infinite" width (compared to a width of the Hall effect region 102). In that case, the isolation ring 109b can be identical to the substrate 108 of the second semiconductive type.

In other words, the closest distance of any contact to the isolation can be larger than or equal to the spacing of this contact to its neighboring contact, e.g., min(D3, D5, D6)≥max(D1). Furthermore, each contact of the at least three contacts 104_1 to 104_n (n≥3) can be arranged such that a distance of the same to the isolation arrangement 109 is greater than a distance to a proximate adjacent contact of the at least three contacts 104_1 to 104_n (n≥3).

Note that this large distance may lead to the following properties of the Hall effect device 100. First, to an increased size of the Hall effect device 100 which may lead to more costs and less spatial resolution of the magnetic fields (for example, if several Hall effect devices 100 are connected together in order to make the whole structure more symmetrical, or if the Hall effect devices 100 are to be calibrated with an on-chip wire/coil; in addition, the mechanical stress and temperature can be less homogeneous over a larger area than over a smaller one, which may lead to inaccuracies). Second, to a reduced magnetic sensitivity of the Hall effect device 100, because at the upper and lower edges of the contacts the current flow lines are arc shaped in lateral direction, which increases their length and thus the resistance of the Hall effect device.

Nevertheless, some embodiments accept an increased size and a reduced sensitivity in order to provide a more linear Hall effect device 100 which finally gives lower residual offset errors when the spinning current principle is applied.

So far, lateral dimensions were discussed. In the following, vertical dimensions and the vertical structure of the Hall effect device 100 for obtaining an electrically linear Hall effect device 100 are discussed.

Figure 5:
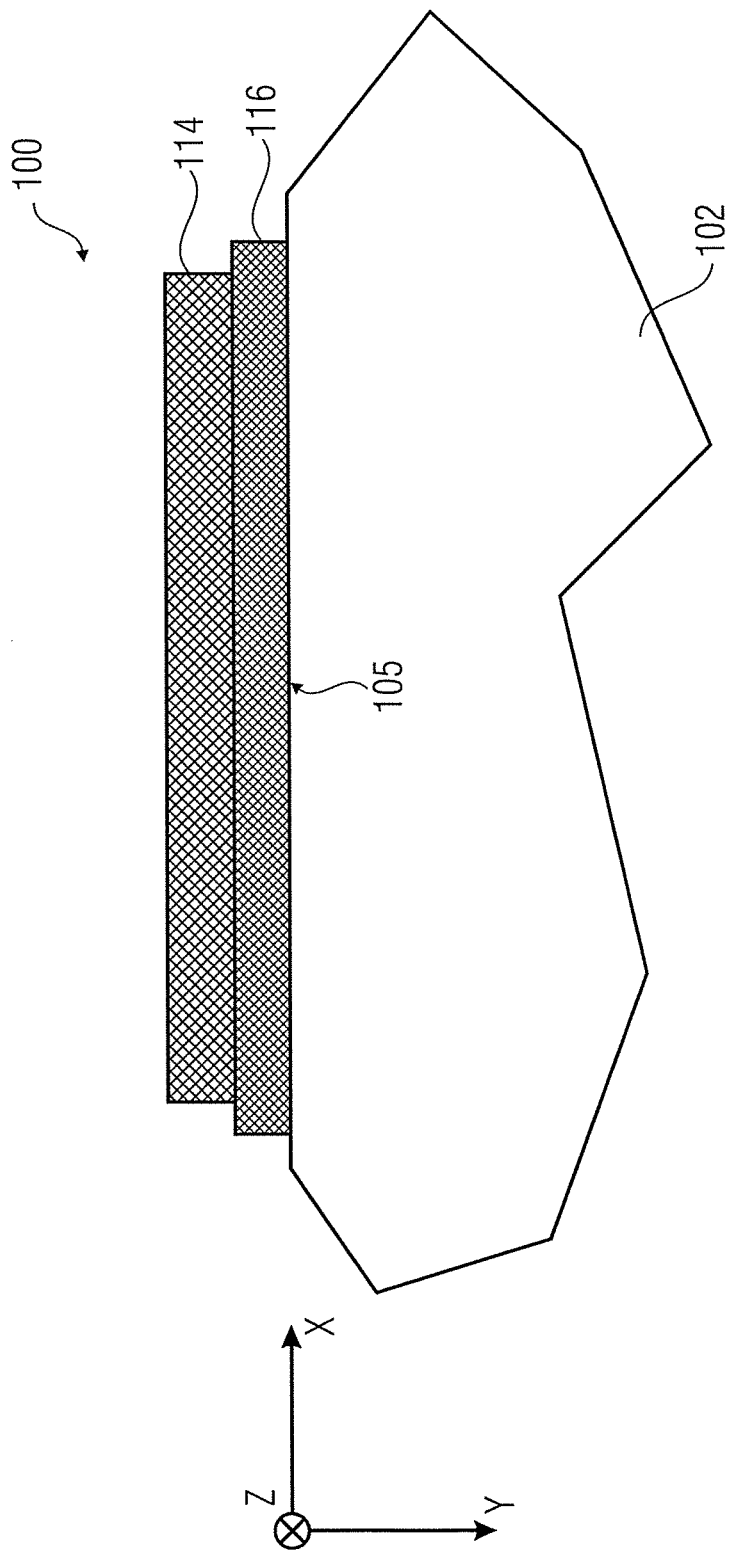
FIG. 5 shows a cross-sectional view of a Hall effect device according to an embodiment.

FIG. 5 shows a cross-sectional view of a Hall effect device 100 according to an embodiment. The Hall effect device 100 comprises a top plate 114 arranged adjacent to the top 105 of the Hall effect region 102 and a dielectric top plate isolation 116 arranged between the top plate 114 and the top 105 of the Hall effect region 102 to isolate the top plate 114 from the Hall effect region 102. In other words, FIG. 5 shows a cross-sectional view of an embodiment of a top plate 114 construction using lowest metal 114 and field oxide 116, for example.

In some embodiments, the top plate 114 can comprise poly-silicon or metal. Furthermore, the dielectric top plate isolation 116 can comprise field oxide. Moreover, a product of a relative permittivity of the dielectric top plate isolation 116 and a thickness of the dielectric top plate isolation 116 can be equal to or greater than 1 µm (or 2 µm, 3 µm, 4 µm, 5 µm, 7 µm or 10 µm).

According to some embodiments, the top plate 114 should not be implemented as a shallow p-implant, because this causes a pn-junction at the top 105 of the Hall effect device 100. Furthermore, p-tubs between neighboring contacts which force the current to dive underneath should also be avoided because they are also sources of pn-junctions. However, some sort of top plate is necessary to prevent the Hall effect device 100 from lifetime drift. Therefore, in some embodiments, a top plate 114 made of poly-silicon or some metal layer can be used. These sorts of top plate 114 can be isolated against the relevant Hall region 106 by some dielectric. The dielectric can be a thick dielectric with low dielectric constant in order to reduce MOSFET effects.

In some embodiments, the Hall effect region 102 can comprise a doping concentration of at least 10E15 cm$^3$ (or 10E16 cm$^3$, or 10E17 cm$^3$). In other words, an increased doping concentration of 10E16/cm$^3$ or even close to 5*10E17/cm$^3$ of the Hall effect region 102 can be used, which is identical to the usual n-CMOS-well. Higher doping may decrease MOSFET effects.

In contrast to using gate-poly-silicon with thin oxide below for the top plate 114, some embodiments, use FOX (FOX=field oxide), because this is thick and reduces parasitic MOSFET effects. The top plate 114 can be made of metal 1, which is the lowest metal layer in one embodiment. It may also be made of metal 2 or higher metal layers, which increases the distance to the Hall effect region 102, yet for higher metal layers there are more process interfaces (intermetal oxides) between the metal and the Hall effect region 102 and each of these interfaces may be a source of traps and mobile ions that are a hazard for lifetime drift. So it depends on the cleanliness of the process if higher metal layers can be used for the construction of the top plate or lowest metal layer.

In some embodiments, the top plate 114 can be connected to ground potential or to supply potential or to some intermediate potential. Alternatively, it may be left floating.

Figure 6:
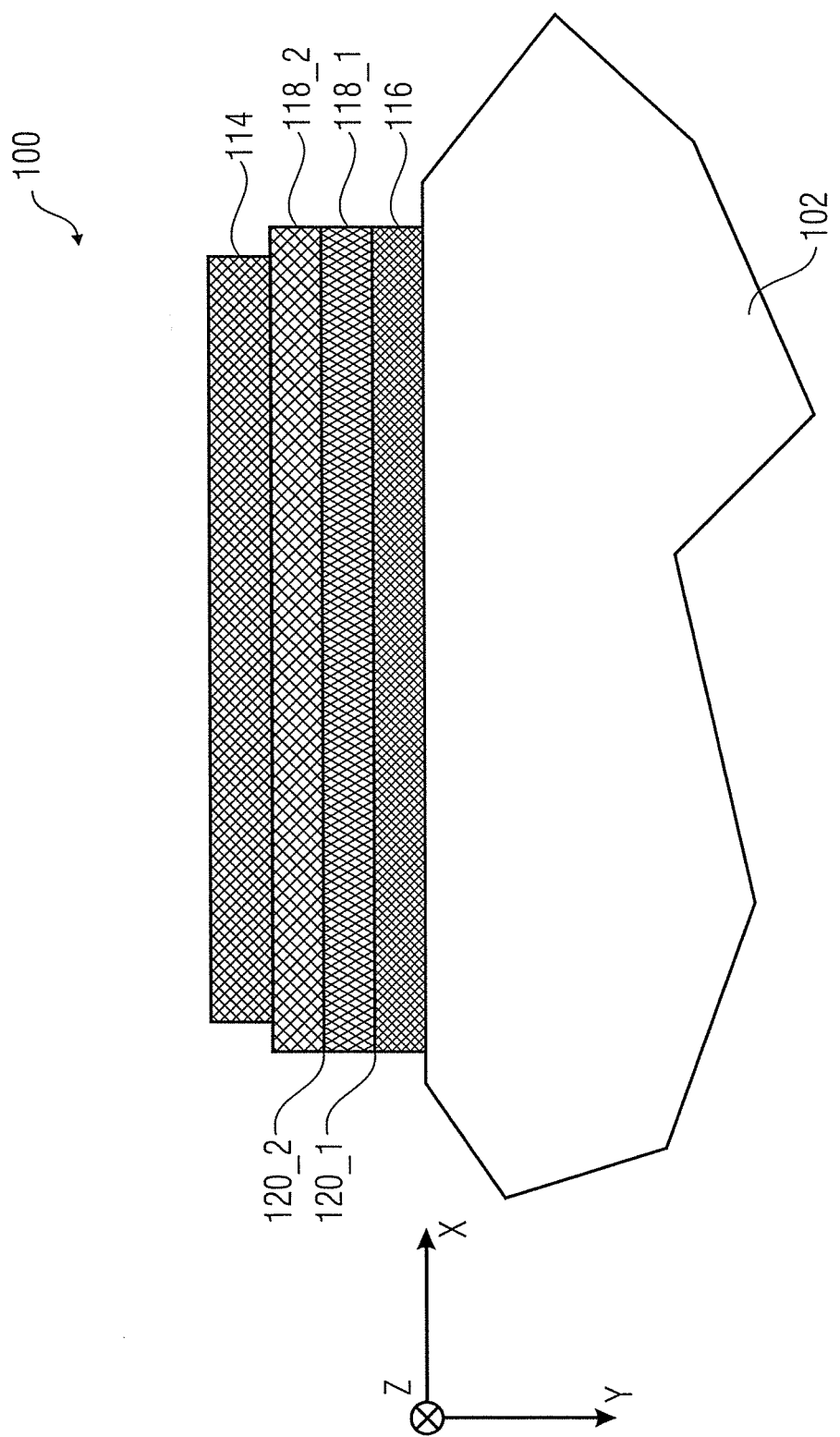
FIG. 6 shows a cross-sectional view of a Hall effect device according to an embodiment.

FIG. 6 shows a cross-sectional view of a Hall effect device 100 according to an embodiment. The Hall effect device 100 comprises a first and second intermetal oxide (IMOX) layer 118_1 and 118_2 arranged between the top plate 114 and the dielectric top plate isolation 116, such that the first intermetal oxide layer 118_1 is adjacent to the dielectric top plate isolation 116 and the second intermetal oxide layer 118_2 is adjacent to the top plate 114. Furthermore, the Hall effect device 100 can comprise a first interface 120_1 arranged between the dielectric top plate isolation 116 and the first intermetal oxide layer 118_1 and a second interface 120_2 arranged between the first and second intermetal oxide layers 118_1 and 118_2. In other words, FIG. 6 shows a cross-sectional view of an embodiment of a top plate 114 with a metal 3 construction with intermetal oxide (IMOX) 118_1 and 118_2 and additional interfaces 120_1 and 120_2 which may contain charge traps and mobile ions.

Figure 7:
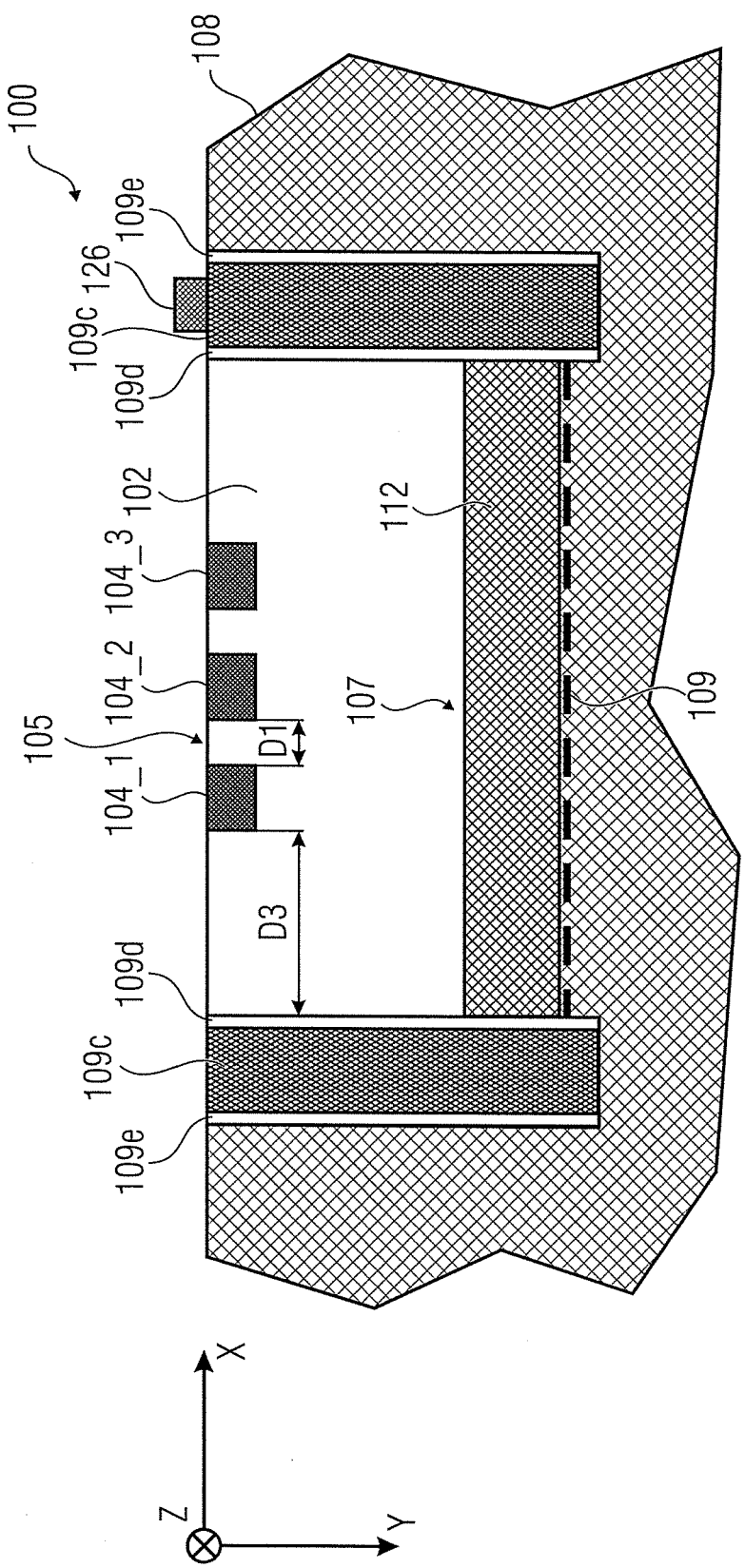
FIG. 7 shows a cross-sectional view of a Hall effect device according to an embodiment.

FIG. 7 shows a cross-sectional view of a Hall effect device 100 according to an embodiment. The Hall effect device 100 comprises a Hall effect region 102 of a first semiconductive type (e.g., n-type), at least three contacts 104_1 to 104_n (n≥3) and a buried layer 112 of the first semiconductive type. The Hall effect region 102 is formed in a substrate 108 of second semiconductive type (e.g., p-type), wherein the substrate 108 comprises an isolation arrangement 109 to isolate the Hall effect region 102 in a lateral direction and in a depth direction from the substrate 108 and/or other electronic devices in the substrate 108. The at least three contacts 104_1 to 104_n (n≥3) are arranged at a top 105 of the Hall effect region 102 to supply the Hall effect device 100 with electric energy and to provide a Hall effect signal indicative of the magnetic field, wherein the Hall effect signal is generated in a portion of the Hall effect region 102 defined by the at least three contacts 104_1 to 104_n (n≥3). The buried layer 112 is formed in the substrate 108 at a bottom 107 of the Hall effect region 102, wherein a doping concentration of the buried layer 112 is higher than a doping concentration of the Hall effect region 102. Moreover, the at least three contacts 104_1 to 104_n (n≥3) are arranged at the top 105 of the Hall effect region 102 such that a lateral distance between the isolation arrangement 109 and each of the at least three contacts 104_1 to 104_n (n≥3) is equal to or greater than a minimum lateral distance between adjacent contacts of the at least three contacts 104_1 to 104_n (n≥3).

In some embodiments, the isolation arrangement can comprise an isolation region 109c and a dielectric layer 109d arranged between the isolation region 109c and the Hall effect region 102, wherein the isolation arrangement can be adapted to provide in an operation mode a homogenous potential over the isolation region 109c.

As shown in FIG. 7, in some embodiments, the isolation region 109c can be a trench 109c coated with a dielectric layer 109d (e.g. oxide) at least in an area adjacent to the Hall effect region 102. Naturally, also both sides of the trench 109c can be coated with dielectric layers 109d and 109e.

In some embodiments, the isolation arrangement 109 can comprise a trench 109c of the second semiconductive type electrically contacting the substrate 108, wherein the trench 109c is coated with oxide 109d at least in an area adjacent to the Hall effect region 102, and wherein a doping concentration of the trench 109c is higher than a doping concentration of the substrate. Furthermore, the trench 109c can comprise a contact 126 arranged at a top of the trench 109c in order to contact the substrate 108 by means of the higher doped trench 109c.

Note that the trench 109c does not need to contact the substrate 108 and then it does not have to have higher doping than the substrate 108 and also the type of doping (n- or p-) is irrelevant. Some embodiments work also with any kind of "exterior region" 109c laterally around the Hall region 102, where this region 109c is at a homogeneous potential and where a dielectric layer 109e is laterally interposed between the Hall effect region 102 and this region 109c.

In other words, in some embodiments, nonlinearity-effects caused by the isolation 109 are avoided through highly conductive layers or rings, e.g., the buried layer 112 as shown in FIGS. 1b, 2b and 7, or the lateral conductive structure 110 as shown in FIGS. 1a and 2a, which act as shields.

For example, a highly conductive n-type buried layer 112 (nBL) may be interposed between the p-type substrate 108 and the n-type relevant Hall region 106. This n-type buried layer 112 pushes the pn-junction to its lower interface nBL/substrate away from the interface Hall region/nBL. So there is no pn-junction directly in the relevant Hall region 106 any more and therefore there is no source for nonlinearity any more.

Note that in FIG. 7, there still can be MOSFET effects at the lateral interfaces between the p-trench ring 109c and the Hall effect region 102. The p-trench 109c can be used to isolate the Hall effect device 100 in CMOS technologies with a buried layer. Thereby, the p-trench 109c can be filled with poly-silicon and make contact to the p-substrate 108. Furthermore, the p-trench 109c can be coated with a thin oxide 109d and 109e to prevent galvanic coupling of the Hall effect device 100 with the substrate 108. These effects can be reduced (or made small) by the large distance D3≥D1 between the contacts 104_1 to 104_n (n≥3) and the trench 109c.

In some embodiments, the n-type buried layer 112 is not contacted or connected, that means its potential is not controlled by any dedicated contact accessible from the top 103 of the die. In that case, the n-type buried layer potential may depend on the potential distribution in the Hall effect region 102.

Note that the n-type buried layer 112 may short the Hall output voltage between the sense contacts (or terminals) of the at least three contacts 104_1 to 104_n (n≥3). However this shorting effect can be reduced (or made small) if the spacing of the supply/sense-contacts (e.g., 3 µm) is smaller than the depth (e.g., 6 µm) of the Hall effect region 106. Here again, some embodiments accept a loss of magnetic sensitivity in order to reduce the nonlinearity of the Hall effect device 100, thereby improving residual offset.

Figure 8:
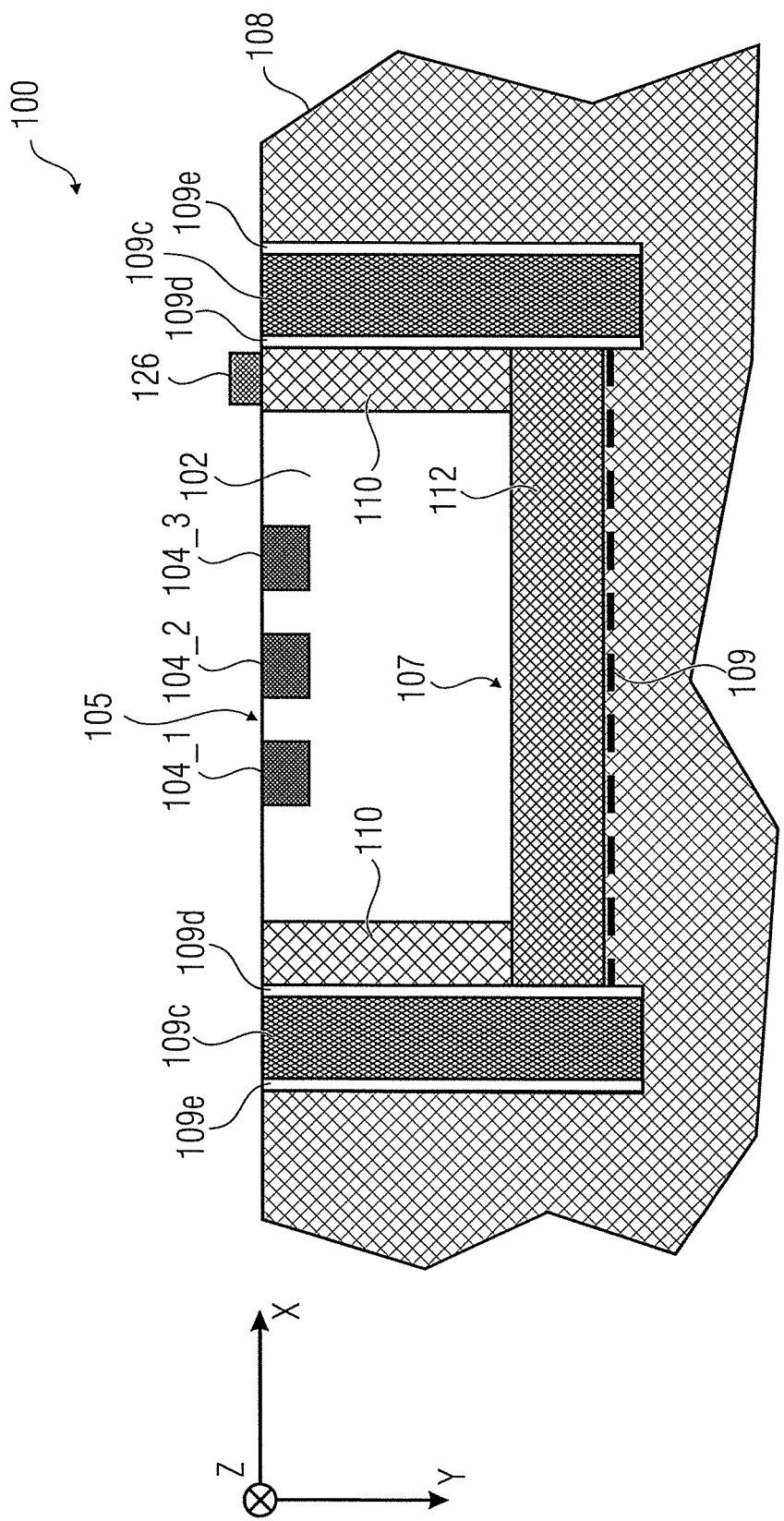
FIG. 8 shows a cross-sectional view of a Hall effect device according to an embodiment.

FIG. 8 shows a cross-sectional view of a Hall effect device 100 according to an embodiment. In contrast to FIG. 7, the Hall effect device 100 shown in FIG. 8 comprises a lateral conductive structure 110 located between the Hall effect region 102 and the isolation arrangement 109, or more precisely, between the Hall effect region 102 and the trench 109c of the second semiconductive type.

In other words, a shielding from MOSFET effects caused by p-trench-rings 109c (or junction field effects caused by p-doped rings) is shown in FIG. 8. Here an additional n-ring with contact 126 is used as a shield between the p-isolation 109c and the relevant Hall effect region 102.

Note that a part of a supply current applied to the supply contacts of the at least three contacts 104_1 to 104_n (n≥3) may flow through the lateral conductive structure and hence not contribute to the Hall effect signal. Therefore, the lateral conductive structure 110 may be formed in the Hall effect region 102 such that the part of the supply current that flows through the lateral conductive structure 110 is smaller than at least 50% than the supply current applied to the supply contacts.

As shown in FIG. 8, the Hall effect device 100 can comprise a contact 126 for the lateral conductive structure 110 arranged at a top of the lateral conductive structure 110. If the lateral conductive structure 110 is formed in the Hall effect region 102 from the top 105 of the Hall effect region 102 in the depth direction (y-direction) over the entire Hall effect region 102 up to the bottom 107 of the Hall effect region 102 such that the lateral conductive structure 110 contacts the buried layer 112, then the contact 126 can be used to apply a potential to the buried layer 112 via the lateral conductive structure 110.

Figure 9:
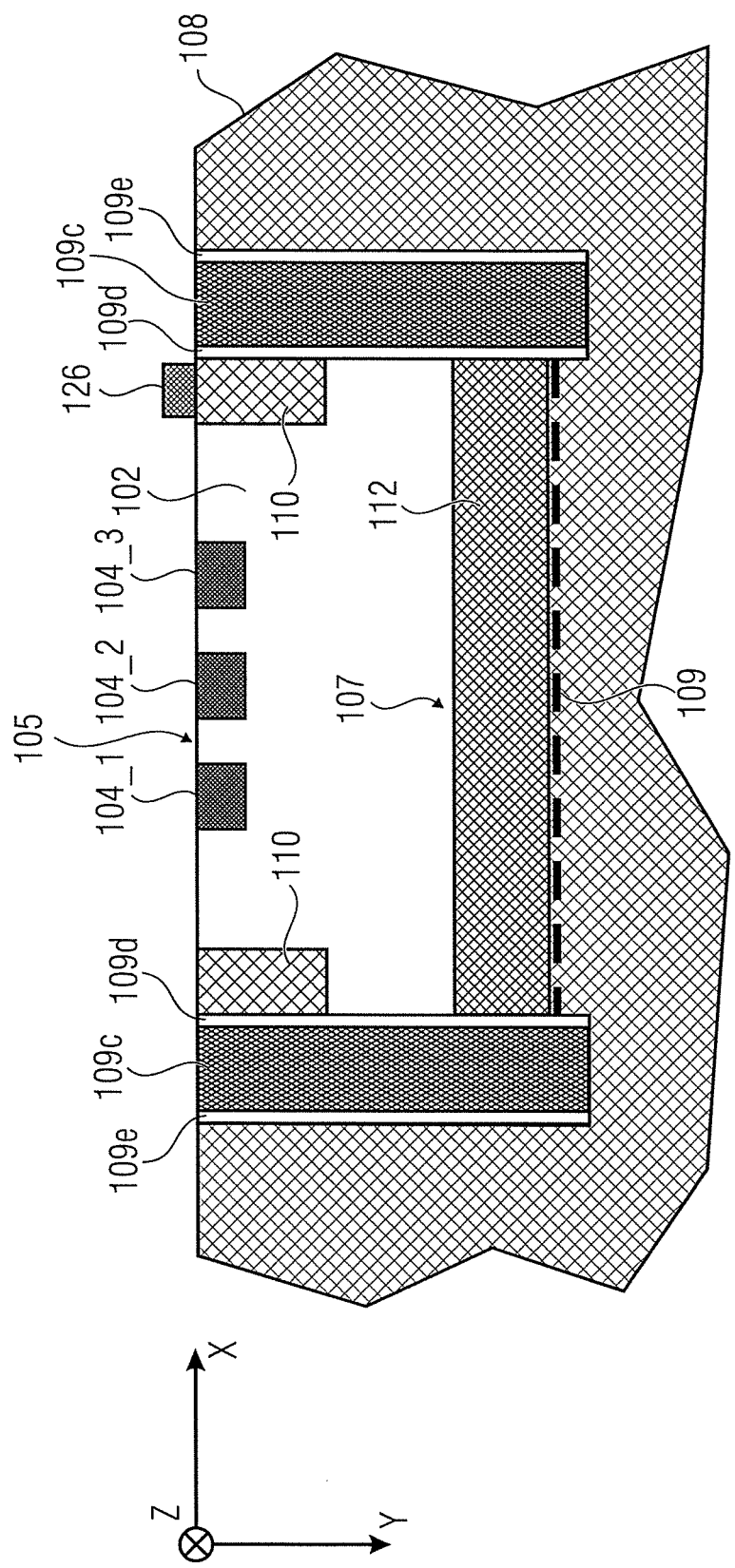
FIG. 9 shows a cross-sectional view of a Hall effect device according to an embodiment.

FIG. 9 shows a cross-sectional view of a Hall effect device 100 according to an embodiment. In contrast to FIG. 8, the lateral conductive structure 110 is formed in the Hall effect region 102 from the top 105 of the Hall effect region 102 in the depth direction (y-direction) towards the bottom 107 of the Hall effect region 102. As shown in FIG. 9, the lateral conductive structure 110 extends from the top 106 of the Hall effect region 102 in the depth direction (y-direction) over only a part of the Hall effect region 102. Hence, the buried layer 112 is not contacted tightly by the lateral conductive structure 110. Yet if the lateral structure 126 is wider in lateral direction than the vertical gap between 126 and 107 the coupling between 126 and 107 can be made more intimate: thus one can implement an arbitrarily good contact between both members by increasing the width of 126.

Moreover, if the lateral conductive structure 110 does only extend from the top of the Hall effect region in the depth direction (y-direction) over only a part of the Hall effect region 102, then the lateral conductive structure 110 can be formed wider such that a low impedance coupling between the lateral conductive structure 110 and the buried layer 112 is provided. In that case, the lateral conductive structure 110 is not directly contacting the buried layer 112 such that a Hall effect region 102 remains between both. In some embodiments the Hall effect region 102 between the lateral conductive structure 110 and the buried layer 112 may be wider (in lateral direction) than depth (in depth direction) and hence comprise a low impedance.

For example, the n-ring 110 can be higher conductive than the n-Hall-region 102 (at least by a factor of 10). It could be made of a collector-deep-diffusion available in several BiC-MOS (BiCMOS=bipolar complementary metal oxide semiconductor) technologies. If a deep diffusion directly contacting the n-type buried layer 112 is not available, then a CMOS-well can be used, which may not be so deep like the Hall effect region 102, but which is a good approximation of the collector deep, particularly if the ring 110 is made wide enough as shown in FIG. 9.

Instead of a n-buried layer 112 it is also possible to use an implantation with sufficient energy so that the peak of the doping concentration occurs at the bottom 107 of the Hall effect region 102 (or Hall well) (e.g., in a depth of about 5 μm from the top surface 103 of the die).

If a lateral conductive structure 110 (or ring-shaped shield) is used, then its distance to the contacts 104_1 to 104_n (n≥3) can be at least half of the distance between the contacts 104_1 to 104_n (n≥3). In that case, most of the current flows in the Hall effect region 102 and only a negligible portion flows over the lateral conductive structure 110 (shield).

Figure 10A:
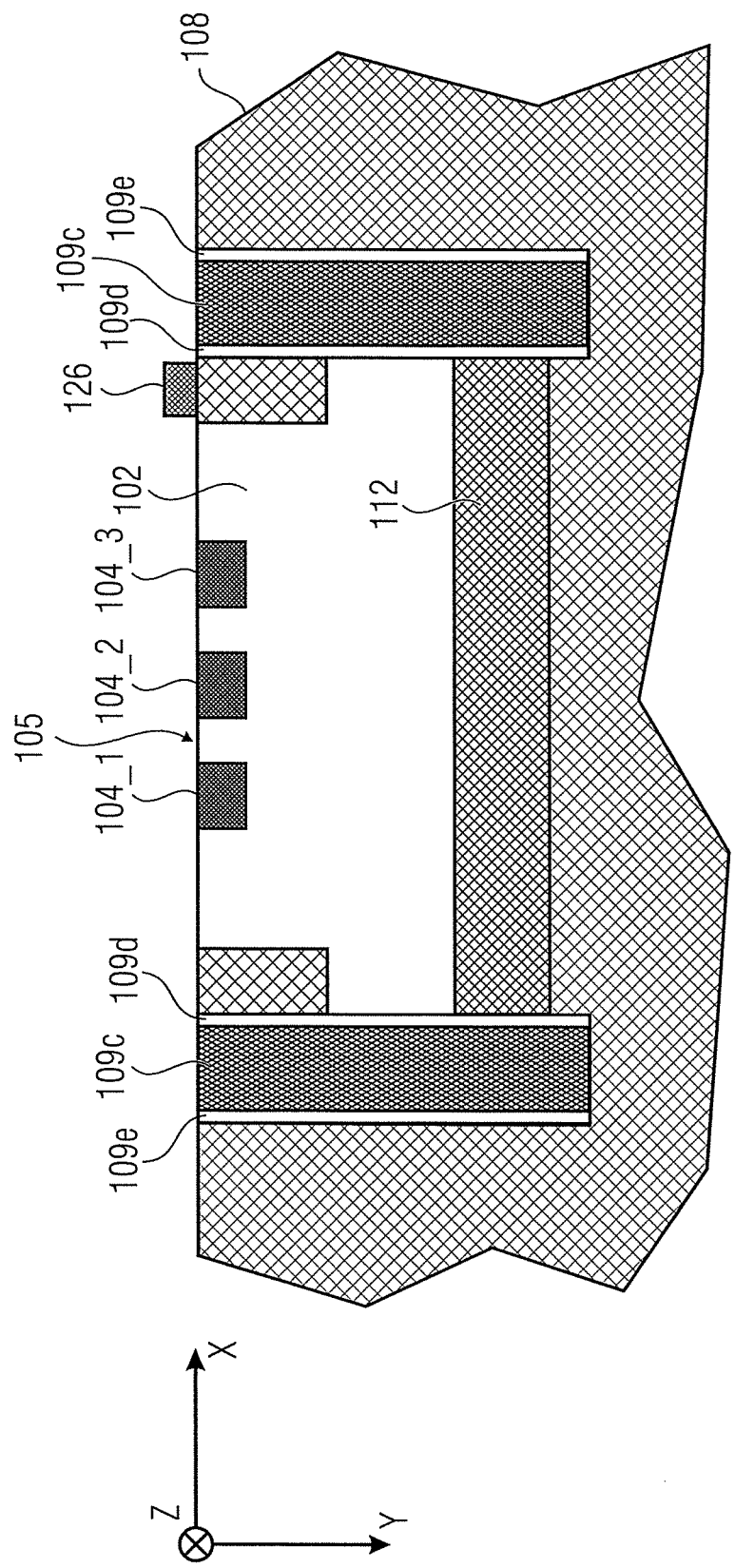
FIG. 10a shows a cross-sectional view of a vertical Hall effect device according to an embodiment.

FIG. 10a shows a top view of a vertical Hall effect device 100, whereas FIG. 10b shows a top view of a corresponding horizontal Hall effect device 100 according to an embodiment. Although shown by way of examples of vertical hall effect devices 100 this principle can also be used for horizontal Hall effect devices 100. Vertical Hall effect devices 100 are defined as sensors indicative of in-plane magnetic fields (=fields parallel to the surface of the die), whereas horizontal Hall effect devices 100 are sensitive to out-of-plane magnetic field (=fields perpendicular to the surface of the die).

Figure 11A:
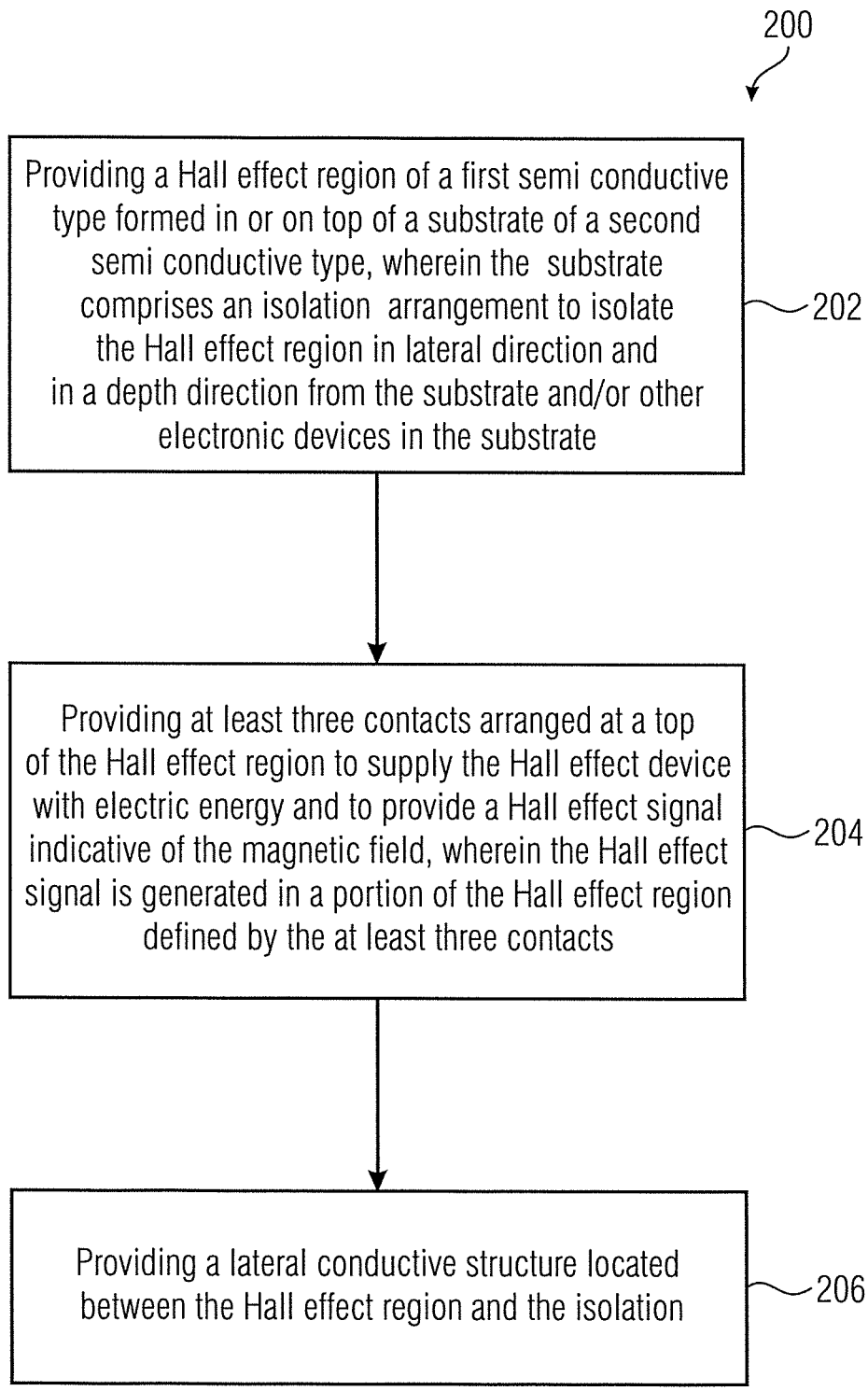

FIG. 11a shows a flowchart of a method 200 for manufacturing a Hall effect device indicative of a magnetic field according to an embodiment. In a first step 202, a Hall effect region of a first semiconductive type is provided, wherein the Hall effect region is formed in or on top of a substrate, wherein the substrate comprises an isolation arrangement to isolate the Hall effect region in lateral direction and in a depth direction from the substrate and/or other electronic devices in the substrate. In a second step 202, at least three contacts are provided, wherein the at least three contacts are arranged at a top of the Hall effect region to supply the Hall effect device with electric energy and to provide a Hall effect signal indicative of the magnetic field, wherein the Hall effect signal is generated in a portion of the Hall effect region defined by the at least three contacts. In a third step 206, a lateral conductive structure is provided, wherein the lateral conductive structure is located between the Hall effect region and the isolation arrangement.

Figure 11B:
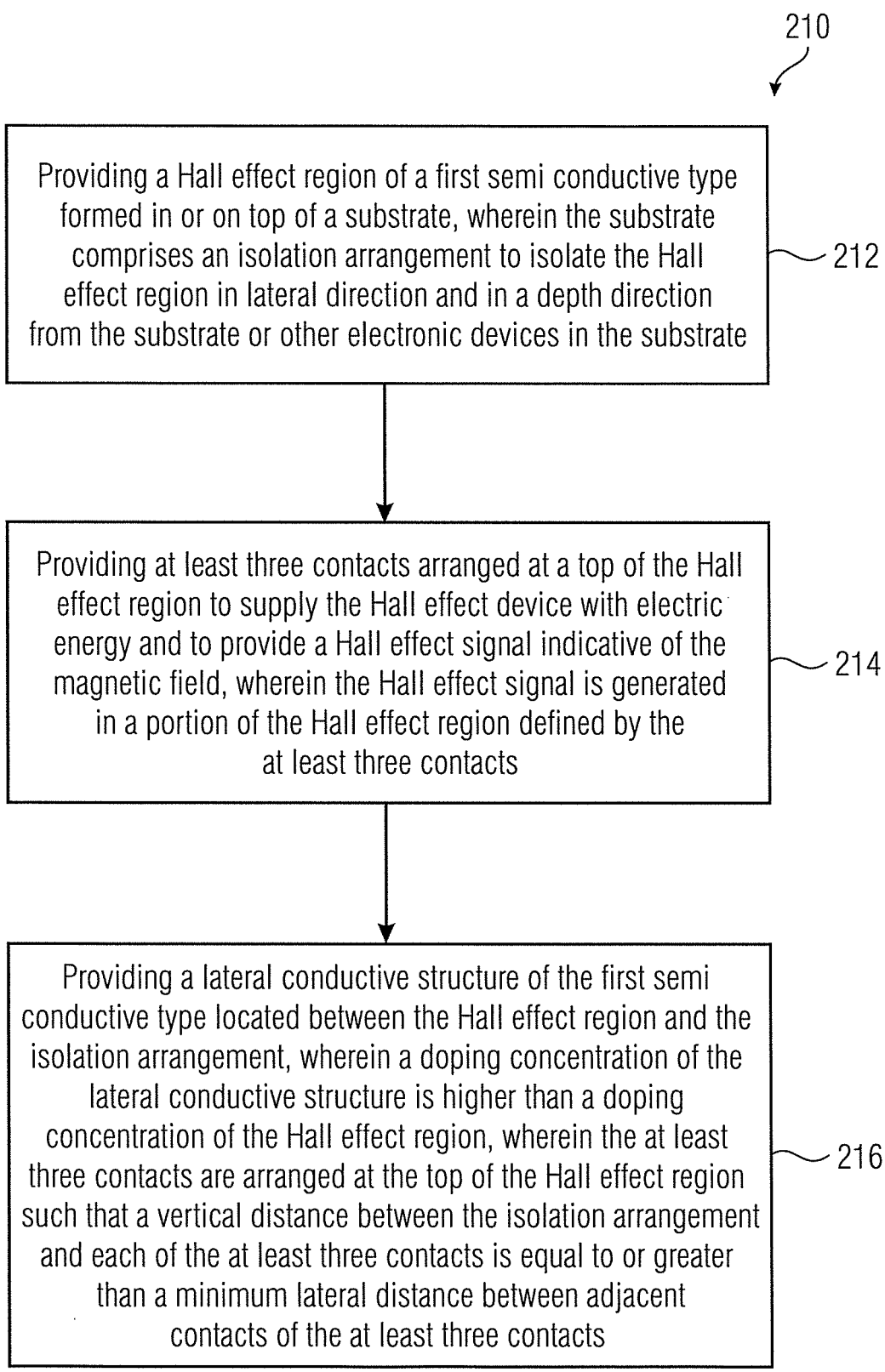

FIG. 11b shows a flowchart of a method 210 for manufacturing a Hall effect device indicative of a magnetic field according to another embodiment. In a first step 212, a Hall effect region of a first semiconductive type is provided, wherein the Hall effect region is formed in or on top of a substrate, wherein the substrate comprises an isolation arrangement to isolate the Hall effect region in lateral direction and in a depth direction from the substrate and/or other electronic devices in the substrate. In a second step 214, at least three contacts are provided, wherein the at least three contacts are arranged at a top of the Hall effect region to supply the Hall effect device with electric energy and to provide a Hall effect signal indicative of the magnetic field, wherein the Hall effect signal is generated in a portion of the Hall effect region defined by the at least three contacts. In a third step 216, a lateral conductive structure of the first semiconductive located between the Hall effect region and the isolation arrangement is provided, wherein a doping concentration of the lateral conductive structure is higher than a doping concentration of the Hall effect region. Thereby, the at least three contacts are arranged at the top of the Hall effect region such that a vertical distance between the isolation arrangement and each of the at least three contacts is equal to or greater than a minimum lateral distance between adjacent contacts of the at least three contacts.

Figure 11C:
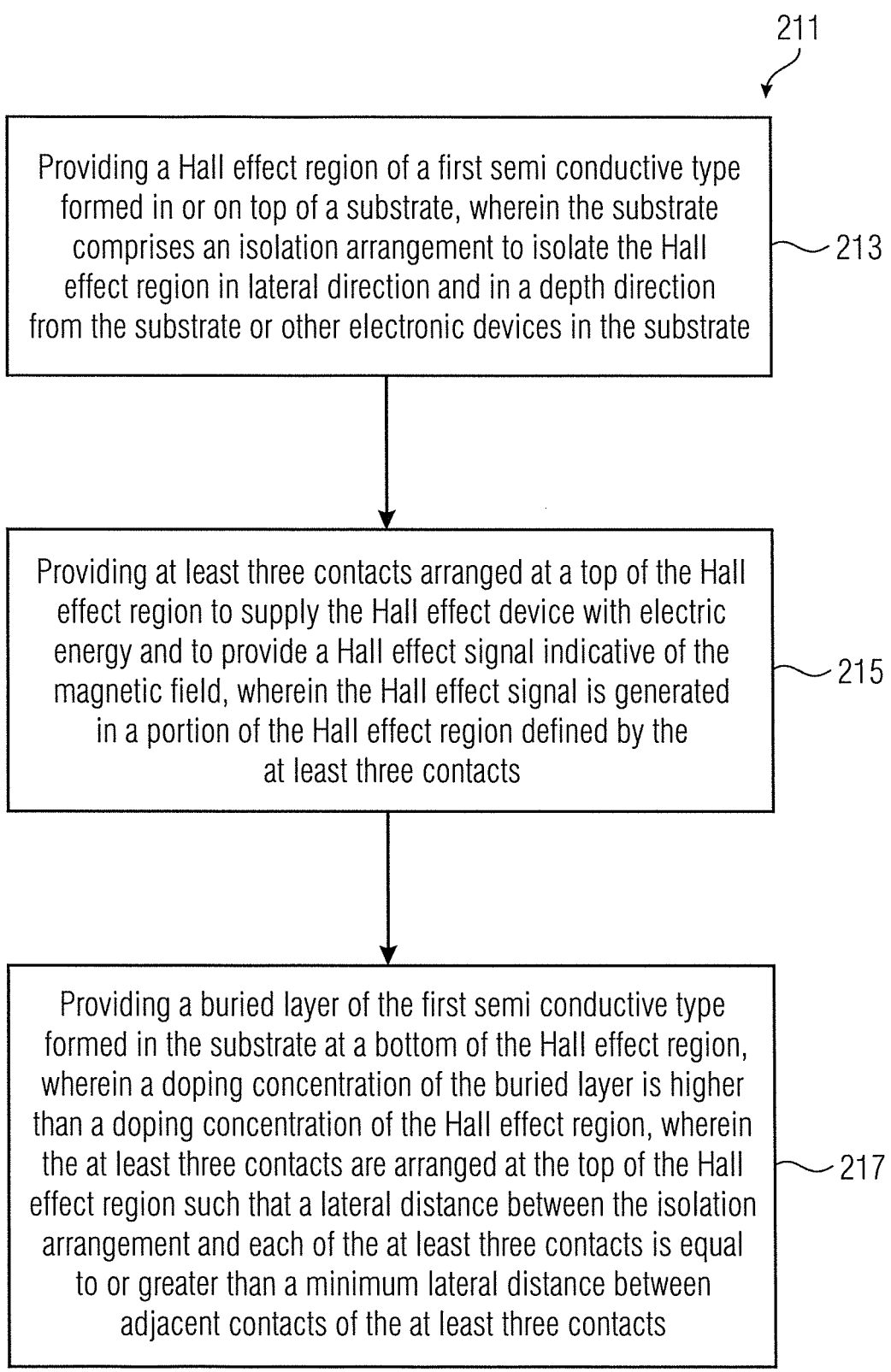
FIG. 11c shows a flowchart of a method for manufacturing the Hall effect device shown in FIG. 2b.

FIG. 11c shows a flowchart of a method 211 for manufacturing a Hall effect device indicative of a magnetic field according to another embodiment. In a first step 213, a Hall effect region of a first semiconductive type is provided, wherein the Hall effect region is formed in or on top of a substrate, wherein the substrate comprises an isolation arrangement to isolate the Hall effect region in lateral direction and in a depth direction from the substrate and/or other electronic devices in the substrate. In a second step 215, at least three contacts are provided, wherein the at least three contacts are arranged at a top of the Hall effect region to supply the Hall effect device with electric energy and to provide a Hall effect signal indicative of the magnetic field, wherein the Hall effect signal is generated in a portion of the Hall effect region defined by the at least three contacts. In a third step 217, a buried layer of the first semiconductive type formed in the substrate at a bottom of the Hall effect region is provided, wherein a doping concentration of the buried layer is higher than a doping concentration of the Hall effect region. Thereby, the at least three contacts are arranged at the top of the Hall effect region such that a lateral distance between the isolation arrangement and each of the at least three contacts is equal to or greater than a minimum lateral distance between adjacent contacts of the at least three contacts.

Figure 12:
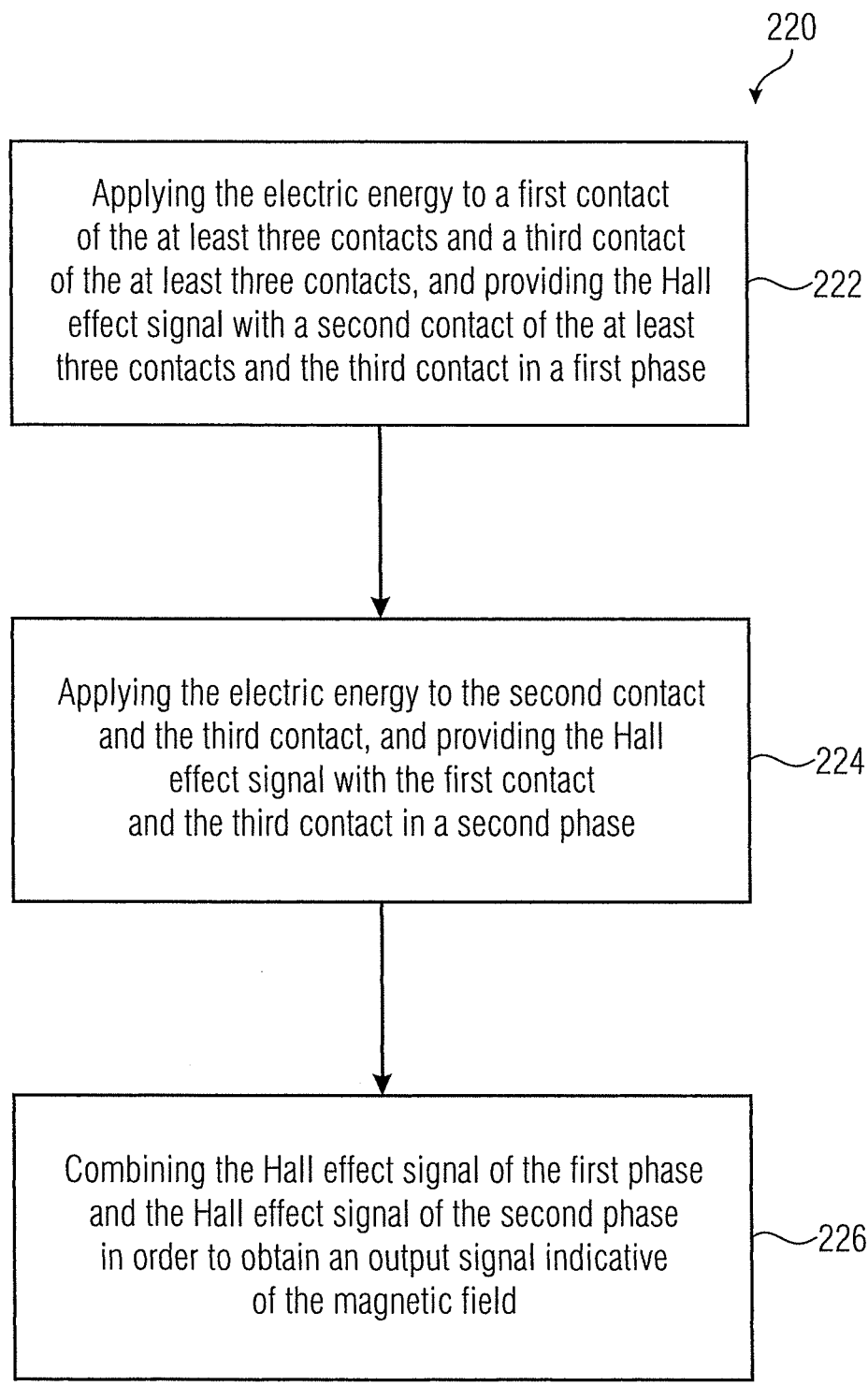
FIG. 12 shows a flowchart of a method for operating the Hall effect device shown in FIG. 1a, the Hall effect device shown in FIG. 2a and the Hall effect device shown in FIG. 2b.

FIG. 12 shows a flowchart of a method 220 for operating the Hall effect device 100 shown in FIG. 1a, the Hall effect device 100 shown in FIG. 2a and/or the Hall effect device shown in FIG. 2b. In a first step 222 or first phase (e.g., first clock phase), the electric energy is applied to a first contact of the at least three contacts and a third contact of the at least three contacts, and the Hall effect signal is provided with a second contact of the at least three contacts and the third contact. In a second step 224 or second phase (e.g., second clock phase), the electric energy is applied to the second contact and the third contact, and the Hall effect signal is provided with the first contact and the third contact in a second phase. In a third step 226, the Hall effect signal of the first phase and the Hall effect signal of the second phase are combined in order to obtain an output signal indicative of the magnetic field.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A Hall effect device indicative of a magnetic field, wherein the Hall effect device comprises:
   a Hall effect region of a first semiconductive type formed in or on top of a substrate, wherein the substrate comprises an isolation arrangement to isolate the Hall effect region in a lateral direction and in a depth direction from the substrate or other electronic devices in the substrate;
   at least three contacts arranged at a top of the Hall effect region to supply the Hall effect device with electric energy and to provide a Hall effect signal indicative of the magnetic field, wherein the Hall effect signal is generated in a portion of the Hall effect region defined by the at least three contacts; and
   a lateral conductive structure of the first semiconductive type located between the Hall effect region and the isolation arrangement, wherein a doping concentration of the lateral conductive structure is higher than a doping concentration of the Hall effect region, wherein the lateral conductive structure comprises a ring shape that laterally surrounds the Hall effect region, and wherein the lateral conductive region and the Hall effect region are in ohmic contact to shield the Hall effect region from the isolation arrangement.

2. The Hall effect device according to claim 1, wherein the Hall effect device comprises a buried layer of the first semiconductive type formed in the substrate at a bottom of the Hall effect region, wherein a doping concentration of the buried layer is higher than a doping concentration of the Hall effect region.

3. The Hall effect device according to claim 1, wherein the lateral conductive structure is formed in the Hall effect region from the top of the Hall effect region in the depth direction towards a bottom of the Hall effect region.

4. The Hall effect device according to claim 1, wherein an electric conductivity of the lateral conductive structure is at least by a factor of 10 higher than an electric conductivity of the Hall effect region.

5. The Hall effect device according to claim 1, wherein the Hall effect device comprises a top plate arranged adjacent to the top of the Hall effect region and a dielectric top plate isolation arranged between the top plate and the top of the Hall effect region to isolate the top plate from the Hall effect region.

6. The Hall effect device according to claim 5, wherein the top plate comprises poly-silicon or metal.

7. The Hall effect device according to claim 5, wherein the dielectric top plate isolation comprises field oxide.

8. The Hall effect device according to claim 5, wherein a product of a relative permittivity of the dielectric top plate isolation and a thickness of the dielectric top plate isolation is equal to or greater than 1 µm.

9. The Hall effect device according to claim 1, wherein the isolation arrangement comprises an isolation region and a dielectric layer arranged between the isolation region and the Hall effect region, wherein the isolation arrangement is adapted to provide in an operation mode a homogenous potential over the isolation region.

10. The Hall effect device according to claim 1, wherein the substrate is of a second semiconductive type, wherein the isolation arrangement is adapted to provide in an operation mode a reverse biased semiconductor junction between the Hall effect region and the substrate.

11. The Hall effect device according to claim 1, wherein the Hall effect region comprises a doping concentration of at least $10^{15}/cm^3$.

* * * * *